United States Patent
Mantegazza et al.

(10) Patent No.: US 9,824,767 B1
(45) Date of Patent: Nov. 21, 2017

(54) METHODS AND APPARATUS TO REDUCE THRESHOLD VOLTAGE DRIFT

(71) Applicant: Intel Corporation, Santa Clara, CA (US)

(72) Inventors: Davide Mantegazza, Palo Alto, CA (US); Feng Pan, Boise, ID (US); Prashant S. Damle, Santa Clara, CA (US); Hanmant Pramod Belgal, El Dorado Hills, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/197,124

(22) Filed: Jun. 29, 2016

(51) Int. Cl.
| | |
|---|---|
| G11C 16/04 | (2006.01) |
| G11C 16/34 | (2006.01) |
| G11C 16/10 | (2006.01) |
| G11C 16/26 | (2006.01) |
| H01L 27/24 | (2006.01) |
| H01L 45/00 | (2006.01) |

(52) U.S. Cl.
CPC .......... *G11C 16/3427* (2013.01); *G11C 16/10* (2013.01); *G11C 16/26* (2013.01); *H01L 27/2481* (2013.01); *H01L 45/06* (2013.01)

(58) Field of Classification Search
None
See application file for complete search history.

(56) References Cited

U.S. PATENT DOCUMENTS

| | | |
|---|---|---|
| 5,659,519 A | 8/1997 | Lee et al. |
| 5,912,839 A | 6/1999 | Ovshinsky et al. |
| 6,377,495 B1 | 4/2002 | Lorenz |
| 6,754,107 B2 | 6/2004 | Khouri et al. |
| 6,933,869 B1 | 8/2005 | Starr et al. |
| 7,046,543 B2 | 5/2006 | Arimoto et al. |
| 7,405,964 B2 | 7/2008 | Philipp et al. |
| 7,542,368 B2 | 6/2009 | Ishikura et al. |
| 7,642,864 B2 | 1/2010 | Chuang et al. |
| 7,697,317 B2 | 4/2010 | Shimaoka et al. |

(Continued)

FOREIGN PATENT DOCUMENTS

| | | |
|---|---|---|
| JP | 2006344349 | 12/2006 |
| WO | 2013184111 | 12/2013 |
| WO | 2015065337 | 5/2015 |

OTHER PUBLICATIONS

Wikipedia, "Phase-Change Memory," Wikipedia, the free encyclopedia, Apr. 13, 2016, retrieved from https://en.wikipedia.org/w/index.php?title=Phase-change_memory&oldid=715061412 on Jun. 13, 2017, 9 pages.

(Continued)

*Primary Examiner* — Son Dinh
*Assistant Examiner* — Uyen B Tran
(74) *Attorney, Agent, or Firm* — Hanley, Flight & Zimmerman, LLC

(57) ABSTRACT

A disclosed example to reduce a threshold voltage drift of a selector device of a memory cell includes providing an applied voltage to the selector device of the memory cell, the applied voltage being less than a threshold voltage of the selector device, and reducing the threshold voltage drift of the memory cell by maintaining the applied voltage at the selector device for a thresholding duration to activate the selector device.

27 Claims, 12 Drawing Sheets

(56) References Cited

U.S. PATENT DOCUMENTS

| | | |
|---|---|---|
| 8,374,022 B2 | 2/2013 | Langtry et al. |
| 8,466,707 B2 | 6/2013 | Mohammad et al. |
| 9,030,906 B2 | 5/2015 | Rivers et al. |
| 9,613,691 B2 | 4/2017 | Mantegazza et al. |
| 2003/0002338 A1 | 1/2003 | Xu et al. |
| 2003/0123284 A1 | 7/2003 | Lowrey et al. |
| 2003/0128598 A1 | 7/2003 | Lim et al. |
| 2004/0184331 A1 | 9/2004 | Hanzawa et al. |
| 2006/0227591 A1 | 10/2006 | Lowrey et al. |
| 2007/0070696 A1 | 3/2007 | Avraham et al. |
| 2007/0285997 A1* | 12/2007 | Shiota ............... G06F 13/161 365/189.08 |
| 2007/0297213 A1 | 12/2007 | Czubatyj et al. |
| 2009/0034325 A1 | 2/2009 | Lowrey et al. |
| 2009/0046495 A1 | 2/2009 | Shimaoka et al. |
| 2009/0052236 A1 | 2/2009 | Bae et al. |
| 2009/0157993 A1 | 6/2009 | Garrett, Jr. |
| 2009/0250677 A1* | 10/2009 | Savransky ............ H01L 45/04 257/2 |
| 2010/0027326 A1 | 2/2010 | Kim et al. |
| 2010/0149857 A1 | 6/2010 | Tang |
| 2011/0103139 A1 | 5/2011 | Kau et al. |
| 2011/0149628 A1 | 6/2011 | Langtry et al. |
| 2011/0188305 A1 | 8/2011 | Yang |
| 2011/0292712 A1 | 12/2011 | Perner |
| 2012/0014173 A1 | 1/2012 | Deng |
| 2012/0320670 A1* | 12/2012 | Kau ...................... G11C 8/10 365/163 |
| 2012/0327708 A1 | 12/2012 | Du et al. |
| 2013/0135925 A1 | 5/2013 | Scheuerlein |
| 2013/0223146 A1 | 8/2013 | Yang |
| 2014/0098593 A1 | 4/2014 | Calderoni et al. |
| 2014/0239512 A1* | 8/2014 | Pellizzer ............ H01L 21/768 257/776 |
| 2014/0376308 A1 | 12/2014 | Wu et al. |
| 2015/0255150 A1 | 9/2015 | Kim et al. |
| 2015/0262661 A1 | 9/2015 | Chu et al. |
| 2015/0302937 A1 | 10/2015 | Roberts et al. |
| 2016/0012886 A1* | 1/2016 | Nazarian ............ G11C 13/004 365/148 |
| 2016/0012892 A1 | 1/2016 | Franklin et al. |
| 2016/0019973 A1* | 1/2016 | Park ................... G11C 16/34 365/185.24 |
| 2016/0049209 A1 | 2/2016 | Pandey et al. |

OTHER PUBLICATIONS

Patent Cooperation Treaty, "International Search Report," issued in connection with International Patent Application No. PCT/US2017/031985, on Aug. 11, 2017, 3 pages.

Patent Cooperation Treaty, "Written Opinion," issued in connection with International Patent Application No. PCT/US2017/031985, on Aug. 11, 2017, 10 pages.

* cited by examiner

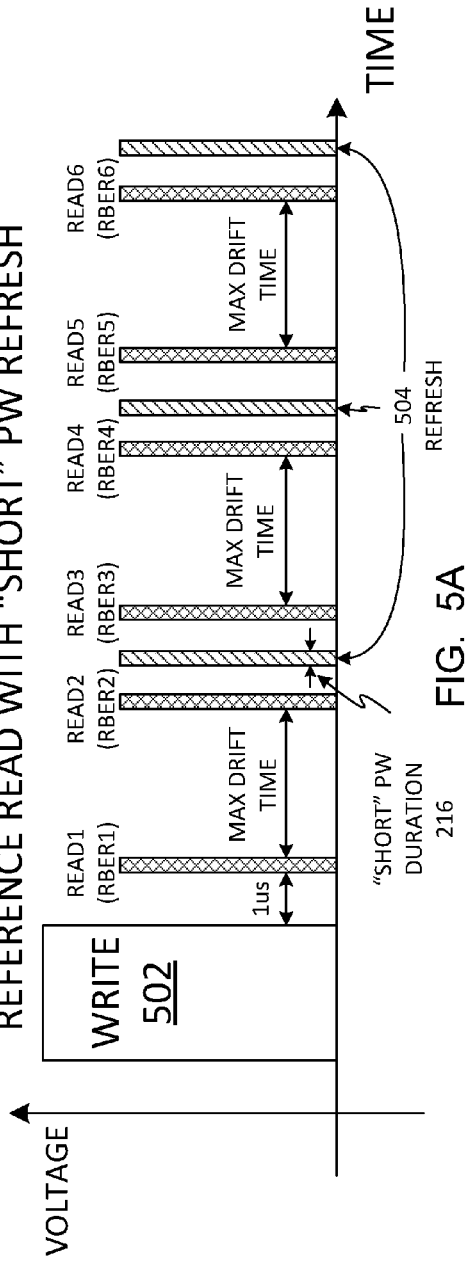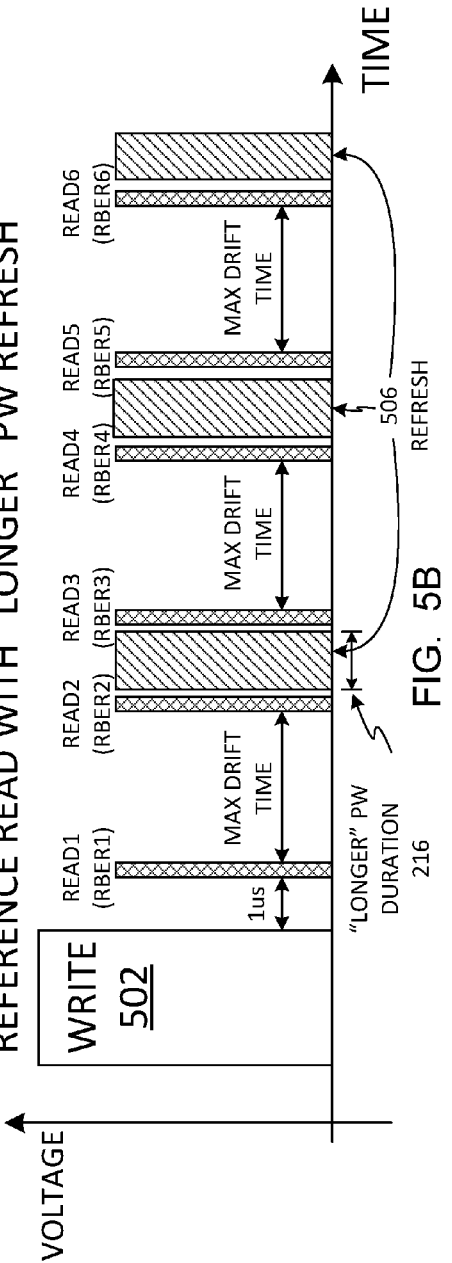

METHODS AND APPARATUS TO REDUCE THRESHOLD VOLTAGE DRIFT

FIELD OF THE DISCLOSURE

The present disclosure relates generally to memory devices and, more particularly, to methods and apparatus to reduce threshold voltage drift.

BACKGROUND

Nonvolatile memory devices are capable of persisting data for extended periods of time without needing to be powered to maintain such data storage. For example, information is written to a nonvolatile flash memory device by changing the electrical characteristics of transistor-based memory cells of the flash memory device to change how such memory cells react to applied voltages. The electrical characteristics of different memory cells in a semiconductor memory device are representative of binary bits that can be read by sensing threshold voltages of the memory cells in response to applied input voltages.

A nonvolatile memory device includes a matrix or array of memory cells. In some memory devices, each memory cell stores a single bit of data. In other memory devices, such as multi-level cell (MLC) memory devices, each memory cell stores multiple bits of data.

BRIEF DESCRIPTION OF THE DRAWINGS

FIG. 5A shows example short refreshes between memory access operations to reduce threshold voltage drift in accordance with the teachings of this disclosure.

FIG. 5B shows example longer refreshes between memory access operations to reduce threshold voltage drift in accordance with the teachings of this disclosure.

The figures are not to scale. Wherever possible, the same reference numbers will be used throughout the drawing(s) and accompanying written description to refer to the same or like parts.

DETAILED DESCRIPTION

Figure 1:
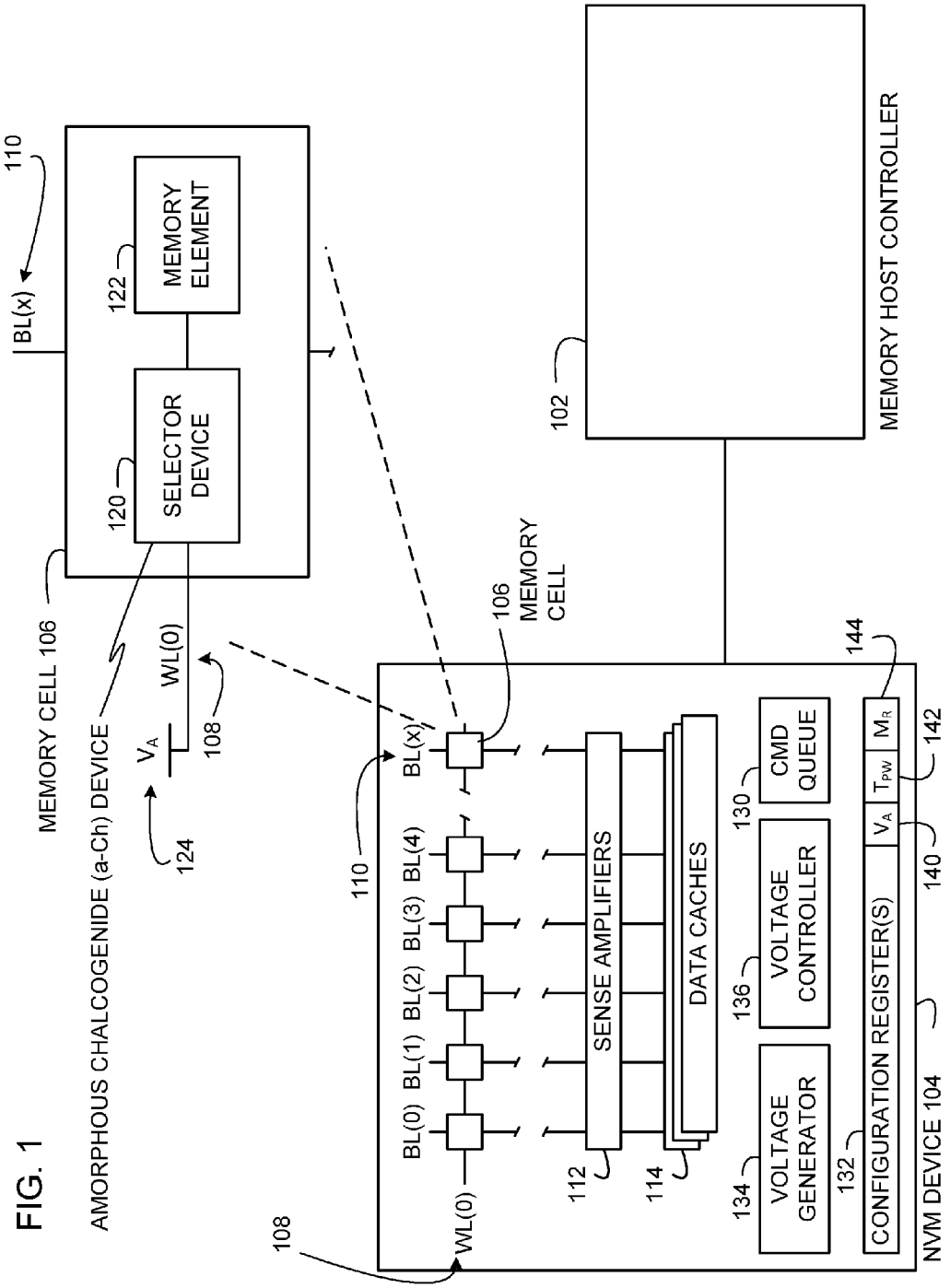
FIG. 1 illustrates an example nonvolatile memory (NVM) device that can be implemented in accordance with the teachings of this disclosure to reduce threshold voltage drift in selector devices of memory cells.

Examples disclosed herein may be used to reduce threshold voltage drift in selector devices of memory cells in nonvolatile memories (NVM). A nonvolatile memory includes a matrix or array of memory cells. In nonvolatile memory devices, memory cells are addressed by activating wordlines (e.g., rows) and bitlines (e.g., columns) such that a memory cell is activated when it is at the intersection of an active wordline and an active bitline. The addressed memory cell can then be read or written. To enable selectively accessing memory cells in a memory device, the memory cells are provided with selector devices (e.g., Ovonic threshold switches (OTS)). That is, activating a selector device enables access to its corresponding memory cell. The selector device is fabricated of a semiconductor material having a threshold voltage characteristic. To activate the selector device, the threshold voltage of the selector device must be exceeded by an applied voltage to allow electrical current to flow or conduct through the selector device, thereby selecting the memory cell and enabling access (e.g., a read or a write) to the corresponding memory cell.

An example material that is used to fabricate selector devices is a Chalcogenide (Ch) material, which may either be used in an amorphous state (amorphous Chalcogenide (a-Ch)) or in a crystalline state (crystalline Chalcogenide (c-Ch)). In cross point memory arrays, selector devices are often fabricated using Chalcogenide in an amorphous state (a-Ch). Electrical current and voltage properties of an amorphous Chalcogenide (a-Ch) material are reflected in an s-shaped I-V (electrical current-voltage) characteristic curve which separates a high-resistivity, low-bias region and a low-resistivity, high-bias region. The bias at which the high-resistivity to low-resistivity transition occurs is called the threshold voltage ($V_{TH}$) of the selector device. When a bias, or applied voltage, greater than the threshold voltage is applied to the selector device, the selector device is activated, or selected. When the selector device is activated, or selected, based on its threshold voltage, the selector device becomes conductive, allowing electrical current to flow through the selector device and, thus, through the corresponding memory cell. That is, when its threshold voltage is exceeded by an applied voltage, the a-Ch material of the selector device decreases in resistance, allowing the flow of electrical current to enable performing a memory access operation (e.g., read, write, etc.) on the corresponding memory cell.

In prior memory devices that include a-Ch selector devices, the selector devices undergo threshold voltage drift due to the a-Ch material properties. This creates a number of challenges for such memory devices in terms of determining voltage levels for use in activating selector devices to selectively access different memory cells. For example, following a write operation, the threshold voltage of a selector device is at its lowest voltage level. However, as time elapses, threshold voltage drift increases the threshold voltage of the selector device. As such, as more time passes since a most recent write operation, the applied voltage or bias needed to selectively activate a memory cell increases due to the increased threshold voltage in the selector device of that memory cell. Activating a memory cell is sometimes referred to herein as thresholding the corresponding selector device of the memory cell as described above by providing an applied voltage, or bias, that exceeds a threshold voltage of the selector device.

To configure or fabricate NVM devices to use sufficiently large applied voltage levels, or biases, to activate selector devices, typical threshold voltage levels of a-Ch selector devices are measured during a design phase. For example, threshold voltages are determined during the design phase by applying incrementally higher biases to selector devices until the selector devices are activated (e.g., their thresholds are exceeded and have switched from a high-resistive state to a low-resistive state to allow the flow of electrical current). During these measurements, the lowest applied voltage that activated the selector devices is identified as the threshold voltage ($V_{TH}$) of the selector devices. The threshold voltage is then programmed or configured in NVM devices during fabrication so that the NVM devices generate an applied voltage during operation for use in activating selector devices to selectively access different memory cells.

In current NVM devices, if an applied voltage is less than a threshold voltage, a selector device is not activated. Thus, when threshold voltage drift increases the threshold voltage of a selector device, the required applied voltage to activate that selector device must also increase. In some current NVM devices, to account for the effects of threshold voltage drift which cause threshold voltages of selector devices to increase over time since a most recent write operation, a worst-case applied voltage level is determined during a design phase as the largest applied voltage level that could be needed during operation of a NVM device based on a worst-case scenario threshold voltage drift. The worst-case applied voltage level is then programmed or configured into NVM devices during fabrication so that the NVM devices can use it during operation to selectively activate different memory cells even during a worst-case threshold voltage drift. However, there are drawbacks to using such a large worst-case applied voltage level to activate selector devices. For example, applying larger voltage biases to memory cells can change the electrical characteristics of such memory cells such that the information stored therein becomes corrupt. In addition, applying larger voltage biases leads to higher power consumption. Such higher power consumption can unfavorably decrease the battery life of portable electronic devices. Such higher power consumption can also cause increased operating temperatures which can lead to faster material degradation and less useful life of electronic devices.

In other prior NVM devices, accounting for threshold voltage drift involves using different applied voltages to activate selector devices based on the amount of threshold voltage drift estimated to have occurred since a most recent write operation. However, such a solution requires configuring multiple applied voltage levels into NVM devices and also involves using large worst-case applied voltage levels.

Examples disclosed herein may be used to reduce threshold voltage drift in selector devices of memory cells in NVM devices by using a single lower pre-drift applied voltage level that is determined to satisfy a pre-drift threshold voltage of selector devices. Although the lower pre-drift applied voltage level is less than a threshold voltage that has increased due to threshold voltage drift, examples disclosed herein involve applying such lower pre-drift applied voltage levels using sufficiently long pulse-width durations that are able to cause thresholding of selector devices even when the lower pre-drift applied voltage level is less than the threshold voltages of those selector devices. Such a result is unexpected in view of prior techniques for activating selector devices that require using applied voltage levels that are greater than the threshold voltage levels of those selector devices. Examples disclosed herein are useful to implement non-volatile memory devices that use less power than current nonvolatile memory devices, that generate less heat than prior nonvolatile memory devices, and/or that require fewer numbers of applied voltage levels to be programmed or configured in the nonvolatile memory devices during fabrication.

Examples disclosed herein are implemented in connection with empirically determining pulse-width durations for use with the lower pre-drift applied voltage levels that will cause a-Ch selector devices to activate even when such lower pre-drift applied voltage levels are less than the threshold voltages of the a-Ch selector devices. That is, using a pulse-width duration that is too short will not provide sufficient electrical stimulus to the a-Ch material in a selector device to threshold or activate the selector device. However, when the lower pre-drift applied voltage level is maintained across the selector device for a sufficiently long duration in accordance with the teachings of this disclosure, the a-Ch material in the selector device is sufficiently electrically stimulated to enter into a low-resistivity state (e.g., thresholding or activating the selector device) and allow the flow of electrical current to enable access to a corresponding memory cell. Although examples disclosed herein are described in connection with selector devices fabricated using a-Ch semiconductor material, examples disclosed herein may additionally or alternatively be used in connection with other types of semiconductor materials having material properties that cause selector device activation when used in connection with lower pre-drift applied voltage levels applied for a sufficiently long pulse-width duration as disclosed herein.

FIG. 1 illustrates an example NVM device 104 that can be implemented in accordance with the teachings of this disclosure to reduce threshold voltage ($V_{TH}$) drift in selector devices of memory cells. For example, the flash memory 104 includes a plurality of memory cells that are generally referred to herein using reference numeral 106. In the illustrated example, the memory cells 106 may be programmed to store information during a programming phase and may be subsequently read one or more times during read phases to read the stored information. During programming and/or read phases of some examples, one or more different ones of the memory cells 106 may be selectively activated to program information only in desired ones of the memory cells 106 and/or to read information from only desired ones of the memory cells 106. Selected ones of the memory cells 106 for programming and/or reading are referred to as target memory cells, and non-selected ones of the memory cells 106 are referred to as non-target memory cells.

The NVM device 104 of the illustrated example is a single-level cell (SLC) NAND flash memory that stores one binary bit value per memory cell 106. However, examples disclosed herein may be implemented in connection with any cross-point memory array, phase change memories (PCM) and/or in connection with NAND flash memories that store multiple bits per memory cell such as two-bit per cell (2bpc) NAND flash memories (often referred to as multi-level cell (MLC) flash memories), 3bpc NAND flash memories (often referred to as triple-level cell (TLC) flash memories), 4bpc NAND flash memories (often referred to as quad-level cell (QLC) flash memories, or any other suitable types of memories that store any number of bits per cell. For example, examples disclosed herein may be used in connection with any type of memory fabricated using semiconductor materials having material properties that cause selector device activation when used in connection with lower pre-drift applied voltage levels that are maintained for a sufficiently long pulse-width duration as disclosed herein.

In the illustrated example, the NVM device 104 is in circuit (e.g., directly or indirectly electrically connected and/or communicatively coupled) with an example memory host controller 102. The example memory host controller 102 of the illustrated example sends memory access commands to the NVM device 104 to perform, for example, read and/or write operations. For example, the memory host controller 102 may be in circuit with a host processor such as the example processor 1212 of FIG. 12. In such instances, the memory host controller 102 may receive a memory access request from the host processor. In turn, the memory host controller 102 sends a corresponding memory access command to the NVM device 104 to cause the NVM device 104 to perform the memory access requested by the host processor. If the requested memory access is a write request, the memory host controller 102 also sends data to be written to the NVM device 104. If the requested memory access is a read request, the memory host controller 102 receives data from the NVM device 104.

In the illustrated example, the memory host controller 102 and the NVM memory 104 may be integrated into a single flash memory integrated circuit (IC) package. For example, the memory host controller 102 and the NVM memory 104 may be on the same semiconductor die and placed into the same IC package, or may be on separate semiconductor die and bonded to one another in the same IC package. Alternatively, the memory host controller 102 may be in a separate IC package from the NVM memory 104. In other examples, the semiconductor dies may not be packaged in IC packages, and may instead be directly bonded to printed circuit boards or films.

In the illustrated example, the memory cells 106 are located in a same wordline (WL(0)) 108 (e.g., a row). Also in the illustrated example, each of the memory cells 106 is located on a corresponding bitline (BL) shown as BL(0) through BL(x) and generally referred to using reference numeral 110. Each of the memory cells 106 of the illustrated example is addressed by activating (e.g., applying an applied voltage ($V_A$) to) the wordline (WL(0)) 108 and precharging a corresponding one of the bitlines BL(0)-BL(x). The NVM memory 104 of the illustrated example is provided with example sense amplifiers 112 to sense programmed states of the memory cells 106. For example, when the wordline (WL(0)) 108 and one or more bitlines BL(0)-BL(x) 110 are selected to activate one or more targeted ones of the memory cells 106, electrical currents flow through the targeted ones of the memory cells 106 based on the threshold voltages ($V_{TH}$) of those memory cells 106. The sense amplifiers 112 latch values based on those electrical currents to identify programmed states of the targeted ones of the memory cells 106. The NVM memory 104 of the illustrated example is provided with example data caches 114 to store values latched by the sense amplifiers 112 corresponding to information stored in the memory cells 106 and provide the information read from the memory cells 106 to the memory host controller 102.

An enlarged view of an example memory cell 106 is shown in FIG. 1. The example memory cell 106 includes an example selector device 120 and an example memory element 122. The example memory element 122 stores information (e.g., one or more bits of data). The example selector device 120 enables selectively activating the memory cell 106 to read and/or write data in the memory element 122. The selector device 120 of the illustrated example is implemented using an Ovonic threshold switch (OTS) fabricated using a-Ch material. The a-Ch material has an s-shaped I-V (electrical current-voltage) characteristic curve which separates a high-resistivity, low-bias region (in which there is no electrical current flow through the selector device 120) and a low-resistivity, high-bias region (in which electrical current flows through the selector device 120).

Figure 2:
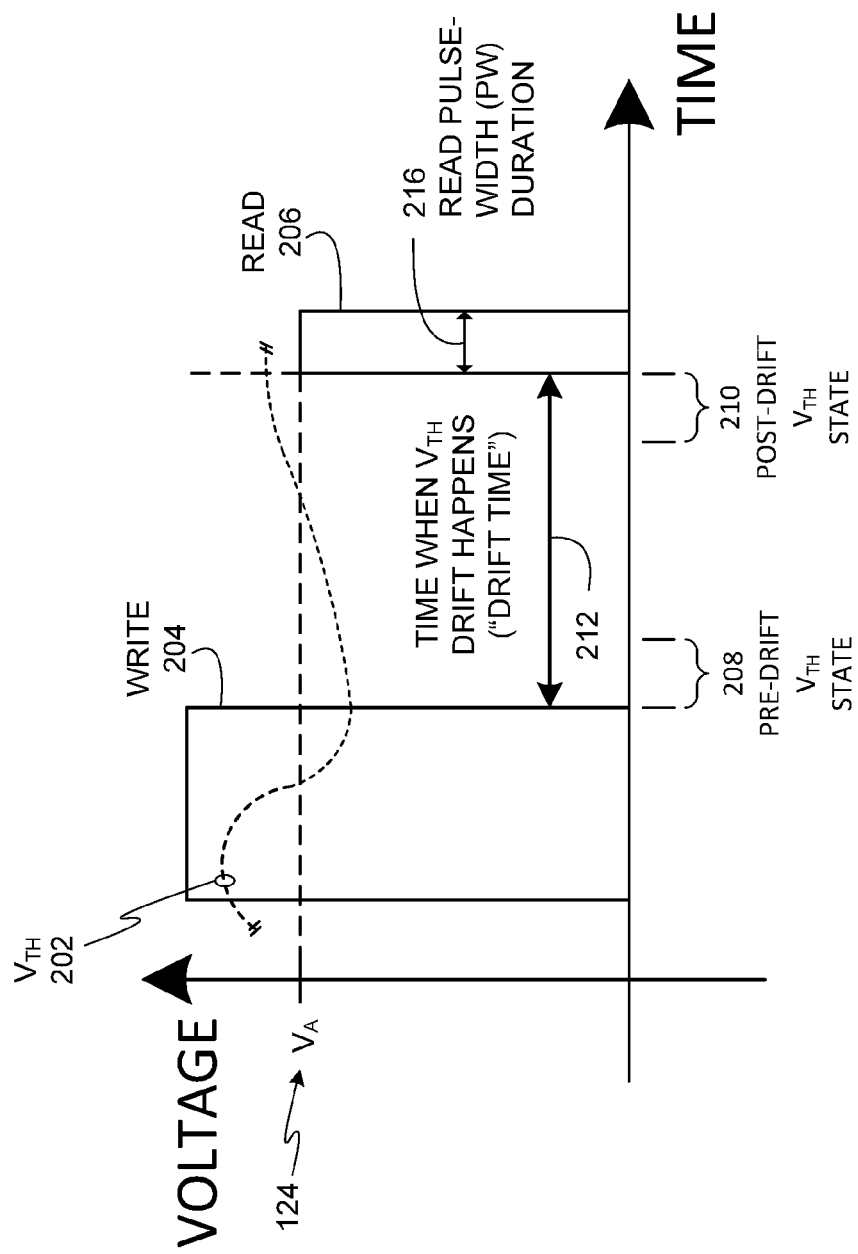
FIG. 2 is an example timeline showing memory operations separated by a drift time during which threshold voltage drift occurs in a selector device of a memory cell.

Referring briefly to the illustrated example of FIG. 2, a threshold voltage ($V_{TH}$) 202 of the selector device 120 (FIG. 1) is shown relative to a write operation 204 and a read operation 206. The threshold voltage ($V_{TH}$) 202 is in a pre-drift $V_{TH}$ state 208 immediately following the occurrence of the write operation 204 and a post-drift $V_{TH}$ state 210 immediately preceding the read operation 206 after a drift time 212 has elapsed since the write operation 204. In NVM devices, write operations require relatively large programming voltage levels (e.g., programming voltages of about 11V~15V) to program data into memory elements (e.g., the memory element 122 of FIG. 1) of memory cells (e.g., the memory cells 106 of FIG. 1). Such large programming voltage levels change the electrical characteristics of the selector device 122 to reduce any previously accumulated threshold voltage ($V_{TH}$) drift of the selector device 122. For this reason, the threshold voltage ($V_{TH}$) 202 of the selector device 122 is at its lowest level when it is in the pre-drift $V_{TH}$ state 208. However, after some drift time 212 following the write operation 204, threshold voltage drift increases the threshold voltage ($V_{TH}$) 202 of the selector device 120 such that it is higher during the post-drift $V_{TH}$ state 210 than during the pre-drift $V_{TH}$ state 208.

Returning to the illustrated example of FIG. 1, an applied voltage ($V_A$) 124 is applied to the wordline (WL(0)) 108 to activate the selector device 120. In examples disclosed herein, the voltage level for the applied voltage ($V_A$) 124 used to activate the selector device 120 during a read operation (e.g., the read operation 206) is selected to exceed, or satisfy, the threshold voltage ($V_{TH}$) 202 of the selector device 120 when in the pre-drift $V_{TH}$ state 208. For example, the threshold voltage ($V_{TH}$) 202 in the pre-drift $V_{TH}$ state 208 may be 2.2V, the threshold voltage ($V_{TH}$) 202 in the post-drift $V_{TH}$ state 210 may be 3.0V, and the applied voltage ($V_A$) 124 may be selected to be 2.7V. Although such an applied voltage 124 is less than the threshold voltage ($V_{TH}$) 202 of the selector device 120 when in the post-drift $V_{TH}$ state 210, using examples disclosed herein the selector device 120 can be effectively activated using such an applied voltage ($V_A$) 124 that is less than the threshold voltage ($V_{TH}$) 202 of the selector device 120 during the post-drift $V_{TH}$ state 210. That is, examples disclosed herein use sufficiently long pulse-width (PW) durations to maintain the applied voltage ($V_A$) 124 at the selector device 120 for a sufficiently long time when in the post-drift $V_{TH}$ state 210 to activate the selector device 120. For example, although the applied voltage ($V_A$) 124 of the read operation 206 of FIG. 2 is less than the threshold voltage ($V_{TH}$) 202 during the post-drift $V_{TH}$ state 210 as shown in FIG. 2, by maintaining the applied voltage ($V_A$) 124 at the selector device 120 for a sufficiently long PW duration 216, the selector device 120 is activated. Activating the selector device 120 in this manner enables access to the corresponding memory element 122 (FIG. 1) of the corresponding memory cell 106 without needing to use larger amounts of energy to generate a larger applied voltage ($V_A$) 124 that exceeds the threshold voltage ($V_{TH}$) 202 during the post-drift $V_{TH}$ state 210.

Returning to FIG. 1, the example NVM memory 104 includes an example command queue 130, one or more example configuration register(s) 132, an example voltage generator 134, and an example voltage controller 136. In the illustrated example, the command queue 130 receives and stores memory access commands from the memory host controller 102. The one or more configuration registers 132 of the illustrated example are provided to include or store an applied voltage ($V_A$) level value 140 and a read PW duration ($T_{PW}$) value 142. In the illustrated example, the applied voltage ($V_A$) level value 140 is used by the voltage generator 134 to generate the applied voltage ($V_A$) 124 for use in activating the selector device 120. In the illustrated example, the read PW duration ($T_{PW}$) value 142 is used by the voltage controller 136 to control the amount of time, or pulse-width duration (e.g., the read PW duration 216 of FIG. 2), for which to maintain the applied voltage ($V_A$) 124 at the selector device 120 (e.g., at the word line 108 of the selector device 120) to activate the selector device 120 based on the applied voltage ($V_A$) level value 140 used for the applied voltage 124. In the illustrated example, the read PW duration ($T_{PW}$) value 142 is selected to satisfy a thresholding duration of the selector device 120. In examples disclosed herein, the thresholding duration is the amount of time that an applied voltage ($V_A$) must be maintained at a selector device 120 to activate the selector device 120 even if the applied voltage ($V_A$) is less than the threshold voltage ($V_{TH}$) of the selector device 120. In examples disclosed herein, the lower the applied voltage ($V_A$), the higher the thresholding duration needed to activate a selector device 120. In some examples, thresholding durations of selector devices 120 for different a-Ch material compositions may be determined empirically during a design phase based on numerous observations while applying different applied voltages ($V_A$) for different PW durations. In some examples, a thresholding duration of a selector device 120 is 15 nanoseconds (ns). In such examples, the read PW duration ($T_{PW}$) value 142 must be selected to be equal to or longer than 15 ns to activate the selector device 120. In other examples, a thresholding duration of a selector device 120 is 20 ns. In such examples, the read PW duration ($T_{PW}$) value 142 must be selected to be equal to or longer than 20 ns to activate the selector device 120.

In some examples, the applied voltage ($V_A$) level value 140 and the read PW duration ($T_{PW}$) value 142 are determined during a design phase and programmed into the one or more configuration registers 132 of the NVM device 104 during a device fabrication phase. In such examples, the NVM device 104 uses the applied voltage ($V_A$) level value 140 and the read PW duration value 142 to reduce threshold voltage ($V_{TH}$) drift in accordance with the teachings of this disclosure without making changes to those values 140, 142. In other examples, the applied voltage ($V_A$) level value 140 and/or the read PW duration value 142 can be changed after the fabrication phase, such as, during initialization and/or operation of the NVM device 104. Some such examples are described below in connection with FIG. 8.

Figure 3:
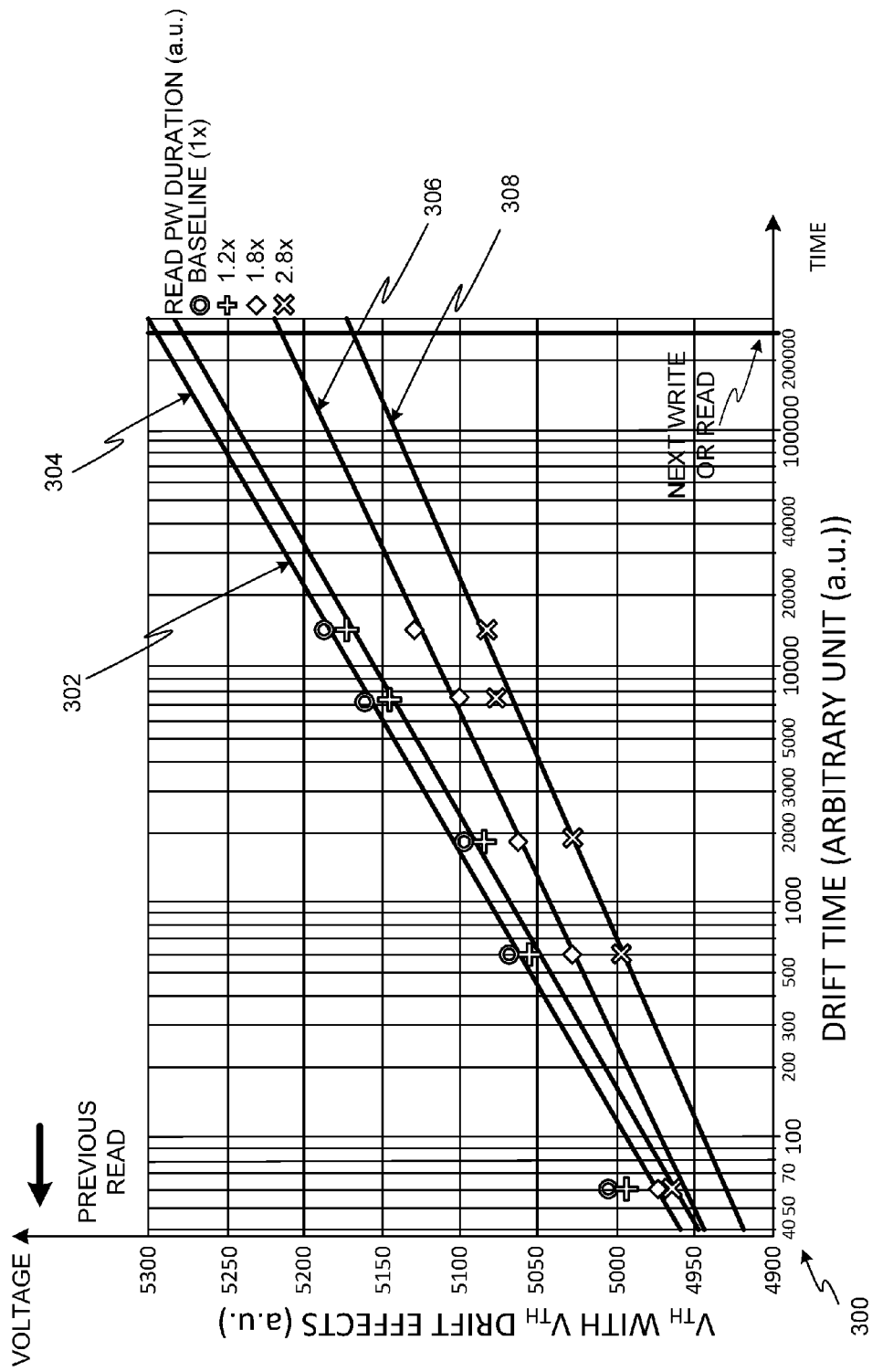
FIG. 3 is an example graph showing threshold voltage drift of a selector device over drift time.

FIG. 3 is an example graph 300 showing selector device threshold voltage ($V_{TH}$) drift over a drift time (e.g., the drift time 212 of FIG. 2). In the illustrated example, the x-axis of the graph 300 represents time, and is used to measure the drift time 212 on a logarithmic scale. The example y-axis of the graph 300 represents voltage, and is used to measure threshold voltages ($V_{TH}$) including the effects of threshold voltage ($V_{TH}$) drift over the drift time 212. In the illustrated example, the timescale of the x-axis and the voltage scale of the y-axis are shown in arbitrary units (a.u.). An arbitrary unit is a relative unit of measure to show a ratio or a comparison between two parameters (e.g., between voltage and time).

In the illustrated example, a plurality of threshold voltage ($V_{TH}$) line plots 302, 304, 306, 308 represent different threshold voltages ($V_{TH}$) of the selector device 120 (FIG. 1). In the illustrated example, the threshold voltage line plots 302, 304, 306, 308 are shown during a drift time between a previous, most recently performed read operation (e.g., the read operation 206 of FIG. 2) of the memory cell 106 (FIG. 1) and a subsequent write or read operation of the memory cell 106. The amounts of threshold voltage ($V_{TH}$) drift affecting the threshold voltage ($V_{TH}$) line plots 302, 304, 306, 308 correspond to different read PW durations (e.g., the read PW duration 216 of FIG. 2) used to maintain the applied voltage ($V_A$) 124 at the selector device 120 during the previous read operation of the memory cell 106.

The threshold voltage ($V_{TH}$) line plot 302 of the illustrated example is representative of a drifting threshold voltage ($V_{TH}$) of the selector device 120 after performing the read operation 206 using a baseline (1×) duration (e.g., 10 ns) for the read PW duration 216. The threshold voltage ($V_{TH}$) line plot 304 of the illustrated example is representative of a drifting threshold voltage ($V_{TH}$) of the selector device 120 after performing the read operation 206 using a 20% PW duration increase (1.2×) (e.g., 12 ns) over the baseline (1×) for the read PW duration 216. The threshold voltage ($V_{TH}$) line plot 306 of the illustrated example is representative of a drifting threshold voltage ($V_{TH}$) of the selector device 120 after performing the read operation 206 using an 80% PW duration increase (1.8×) (e.g., 18 ns) over the baseline (1×) for the read PW duration 216. The threshold voltage ($V_{TH}$) line plot 308 of the illustrated example is representative of a drifting threshold voltage ($V_{TH}$) of the selector device 120 after performing the read operation 206 using a 180% PW duration increase (2.8×) over the baseline (1×) for the read PW duration 216. As shown in the illustrated example of FIG. 3, using longer PW durations for read operations reduces the effects of threshold voltage ($V_{TH}$) drift in the threshold voltages ($V_{TH}$) of selector devices.

Figure 4:
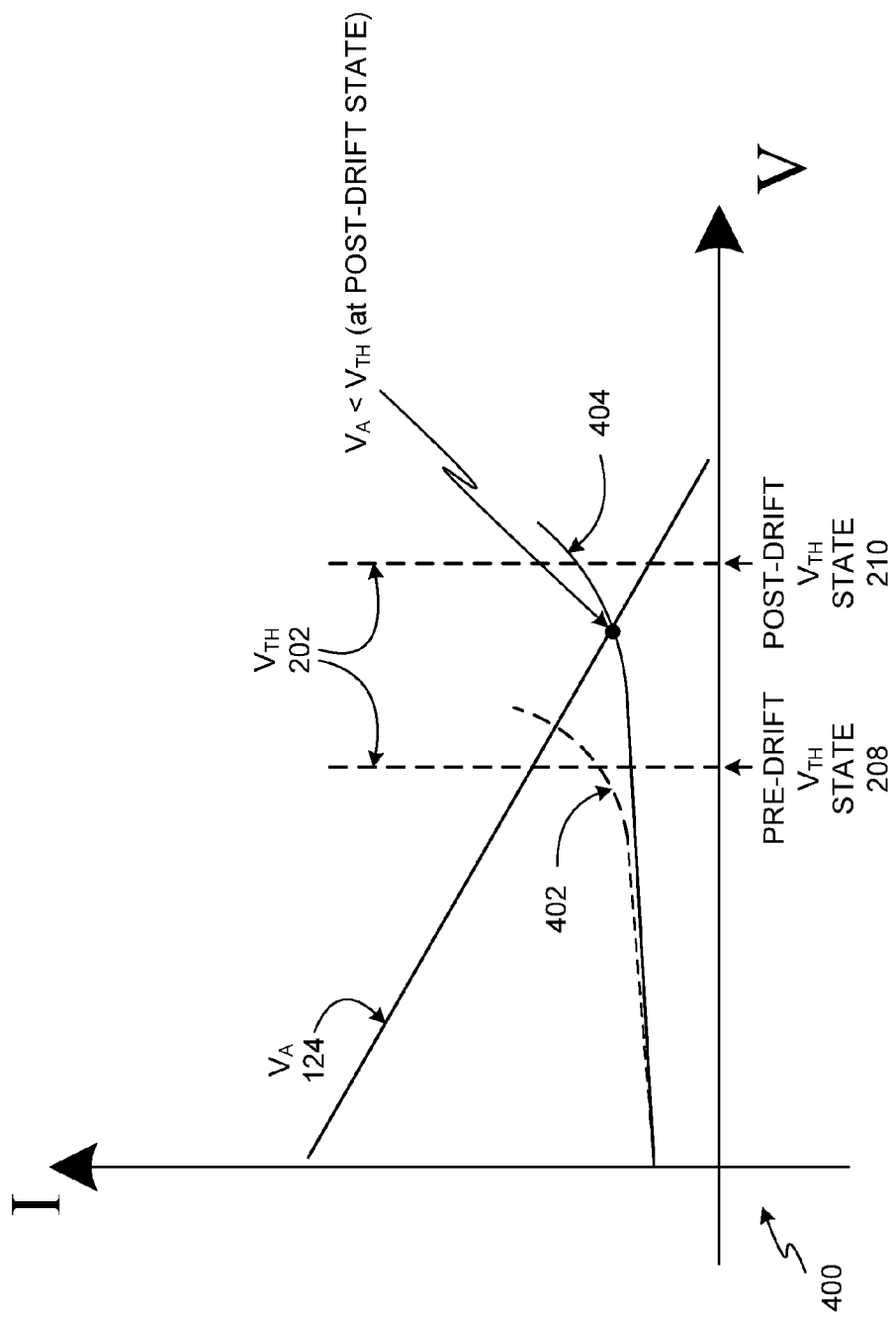
FIG. 4 depicts example electrical current-voltage (I-V) characteristic curves of a selector device of the example nonvolatile memory device of FIG. 1 relative to an applied voltage used to reduce threshold voltage drift of the selector device in accordance with the teachings of this disclosure.

FIG. 4 depicts example electrical current-voltage (I-V) characteristic curves 402, 404 of the selector device 120 (FIG. 1) of the example NVM device 104 of FIG. 1. The example I-V characteristic curves 402, 404 correspond to the threshold voltage ($V_{TH}$) 202 (FIG. 2) of the selector device 120 as it drifts relative to an elapsed drift time (e.g., the drift time 212 of FIG. 2). For example, the I-V characteristic curve 402 corresponds to the threshold voltage ($V_{TH}$) 202 during the pre-drift $V_{TH}$ state 208 (FIG. 2). That is, the I-V characteristic curve 402 is representative of the electrical current flow characteristics of the selector device 120 based on the threshold voltage ($V_{TH}$) 202 of the selector device 120 immediately following a memory access operation (e.g., a write or read operation) that reduced or eliminated the effects of threshold voltage ($V_{TH}$) drift. In the illustrated example, the I-V characteristic curve 404 corresponds to the threshold voltage ($V_{TH}$) 202 during the post-drift $V_{TH}$ state 210 (FIG. 2). That is, the I-V characteristic curve 404 of the illustrated example is representative of the electrical current flow characteristics of the selector device 120 based on the threshold voltage ($V_{TH}$) 202 of the selector device 120 after an amount of drift time has elapsed following the most recent memory access operation.

Referring again to FIG. 2, using examples disclosed herein, to reduce threshold voltage ($V_{TH}$) drift, the NVM device 104 of FIG. 1 is configured to generate a voltage level for the applied voltage ($V_A$) 124 that exceeds the threshold voltage ($V_{TH}$) 202 during the pre-drift $V_{TH}$ state 208 but is less than the threshold voltage ($V_{TH}$) 202 during the post-drift $V_{TH}$ state 210. The read operation 206 of the illustrated example can either be an intentional read that the NVM device 104 uses to read data from the memory cell 106 (e.g., based on a read operation requested by the memory host controller 102 to access stored data). Alternatively, the read operation 206 can be a "dummy" read operation that is used as a refresh operation (e.g., a read-refresh operation) but not intended to process a requested read operation (e.g., a read operation requested by the memory host controller 102). In some examples, a refresh mode ($M_R$) setting 144 (FIG. 1) may be stored in the one or more configuration registers 132 (FIG. 1) of the NVM device 104 to specify whether to use intentional read operations or "dummy" read operations. In either case, the NVM device 104 performs the read operation 206 using the applied voltage ($V_A$) 124 after a drift time 212 to reduce the threshold voltage ($V_{TH}$) 202 from its voltage level during the post-drift $V_{TH}$ state 210 to a voltage level during the pre-drift $V_{TH}$ state 208. For example, the NVM device 104 applies the applied voltage ($V_A$) 124 to the selector device 120 during the read operation 206 using a read PW duration (e.g., the read PW duration 216 of FIG. 2) that is sufficiently long to cause the selector device 120 to activate and the threshold voltage ($V_{TH}$) of the selector device 120 to decrease. A sufficiently long duration for the read PW duration may be empirically determined using laboratory testing and/or simulations of different devices under different conditions (e.g., material characteristics, durations of drift time, etc.) and programmed into the NVM device 104 at a time of fabricating the NVM device and/or during a firmware initialization of the NVM device 104 (e.g., during a system boot process). In some examples, 10 ns is not a sufficiently long duration, while 15 ns is a sufficiently long duration. In other examples, 15 ns is not a sufficiently long duration, while 20 ns is a sufficiently long duration.

When the read operation 206 is an intentional read operation that the NVM device 104 performs in response to a read request from the memory host controller 102 (FIG. 1), the NVM device 104 returns the data read from the memory cell 106 to the memory host controller 102. When using the read operation 206 as a refresh operation, instead of as an intentional read operation, the read operation 206 is referred to as a "dummy" read operation because the read operation 206 is used as a refresh to reduce the effects of threshold voltage ($V_{TH}$) drift. That is, the NVM device 104 can discard or ignore data returned from the read operation 206 when the "dummy" read operation is used as a refresh operation.

Determining whether to use an intentional read operation or a "dummy" read operation as a refresh operation to reduce the effects of threshold voltage ($V_{TH}$) drift may be based on desired or required memory access performances for particular applications, processes, and/or other circumstances. For example, a long read PW duration 216 required to reduce threshold voltage ($V_{TH}$) drift may be prohibitively long for use during intentional read operations in connection with applications or processes requiring higher data throughputs than cannot be achieved when using such a long read PW duration 216. In some examples, a long read PW duration 216 required to reduce threshold voltage ($V_{TH}$) drift may be prohibitively long for use during intentional read operations when a large number of commands are pending in the command queue 130 (FIG. 1), and higher performance is required to process those pending commands within a particular time that would be exceeded by performing intentional read operations using a read PW duration 216 that is too long. For example, if a performance-critical process is to be executed based on a fastest possible memory access time, and the NVM device 104 is specified to have a minimum read cycle time of 50 ns, a read PW duration 216 of 50 ns or more (or any PW duration 216 that prohibits achieving the minimum read cycle time of 50 ns) would be too long. As such, when data throughput performance requirements are higher than can be achieved when using a longer read PW duration 216, the longer read PW duration 216 required to reduce threshold voltage ($V_{TH}$) drift can instead be used to perform refresh operations based on "dummy" read operations. In such examples, after an amount of drift time 212 elapses since a most recent write or read operation, the NVM device 104 may perform a refresh operation using a sufficiently long PW duration 216 to reduce the effects of threshold voltage ($V_{TH}$) drift on the threshold voltage ($V_{TH}$) 202. A sufficiently long duration for the refresh operation may be empirically determined using laboratory testing and/or simulations of different devices under different conditions (e.g., material characteristics, durations of drift time, etc.) and programmed into the NVM device 104 at a time of fabricating the NVM device and/or during a firmware initialization of the NVM device 104 (e.g., during a system boot process). In some examples, 10 ns is not a sufficiently long duration, while 15 ns is a sufficiently long duration. In other examples, 15 ns is not a sufficiently long duration, while 20 ns is a sufficiently long duration.

FIGS. 5A and 5B illustrate timings for using different read PW durations (e.g., the read PW duration 216 of FIG. 1) for refresh operations (e.g., read-refresh operations) to reduce threshold voltage ($V_{TH}$) drift in selector devices (e.g., the selector device 120 of FIG. 1). In the illustrated examples of FIGS. 5A and 5B, a write operation 502 is followed by a plurality of read operations READ1-READ6. Also in the illustrated example, maximum drift times are shown separating some of the read operations. In addition, refresh operations 504, 506 (e.g., read-refresh operations) are shown as performed between some of the read operations. The refresh operations 504, 506 are performed in accordance with the teachings of this disclosure (e.g., the intentional read operations and/or the "dummy" read operations as described above in connection with FIG. 4) to reduce threshold voltage ($V_{TH}$) drift in the selector device 120.

The PW durations of the refresh operations 504 shown in FIG. 5A are relatively shorter than the PW durations of the refresh operations 506 shown in FIG. 5B. In some instances, the relatively shorter PW durations of the refresh operations 504 shown in FIG. 5A may be used to reduce threshold voltage ($V_{TH}$) drift that is relatively small such as when a small amount of drift time has elapsed since a most recent memory access operation (e.g., a read or write operation). However, when a long drift time has elapsed (e.g., a drift time that creates a threshold voltage ($V_{TH}$) drift that is too large for the relatively shorter PW durations of the refresh operations 504 shown in FIG. 5A to reduce the large threshold voltage ($V_{TH}$) drift), the relatively longer PW durations of the refresh operations 506 shown in FIG. 5B may be used to reduce relatively larger threshold voltage ($V_{TH}$) drifts.

In the illustrated example, each read operation READ1-READ6 is associated with a corresponding raw bit error rate (RBER) RBER1-RBER6. Determining whether to use relatively shorter PW durations (e.g., as shown in FIG. 5A) or relatively longer pulse with durations (e.g., as shown in FIG. 5B) may be determined through an empirical process during a design phase based on observed amounts of RBER resulting from data reads. For example, for long drift times between memory access operations, the shorter PW durations used for the refresh operations 504 of FIG. 5A may result in an unacceptably high RBER. In such examples, NVM devices (e.g., the NVM device 104 of FIG. 1) may be configured to use relatively longer PW durations such as shown for the refresh operations 506 of FIG. 5B to reduce the amount of RBER. Empirical observations during a design phase may be used in this manner to make design trade-offs between performance and acceptable RBER by selecting refresh operation PW durations that are sufficiently short to produce a desired performance without generating an RBER that is unacceptably high relative to a data integrity requirement.

Figure 6:
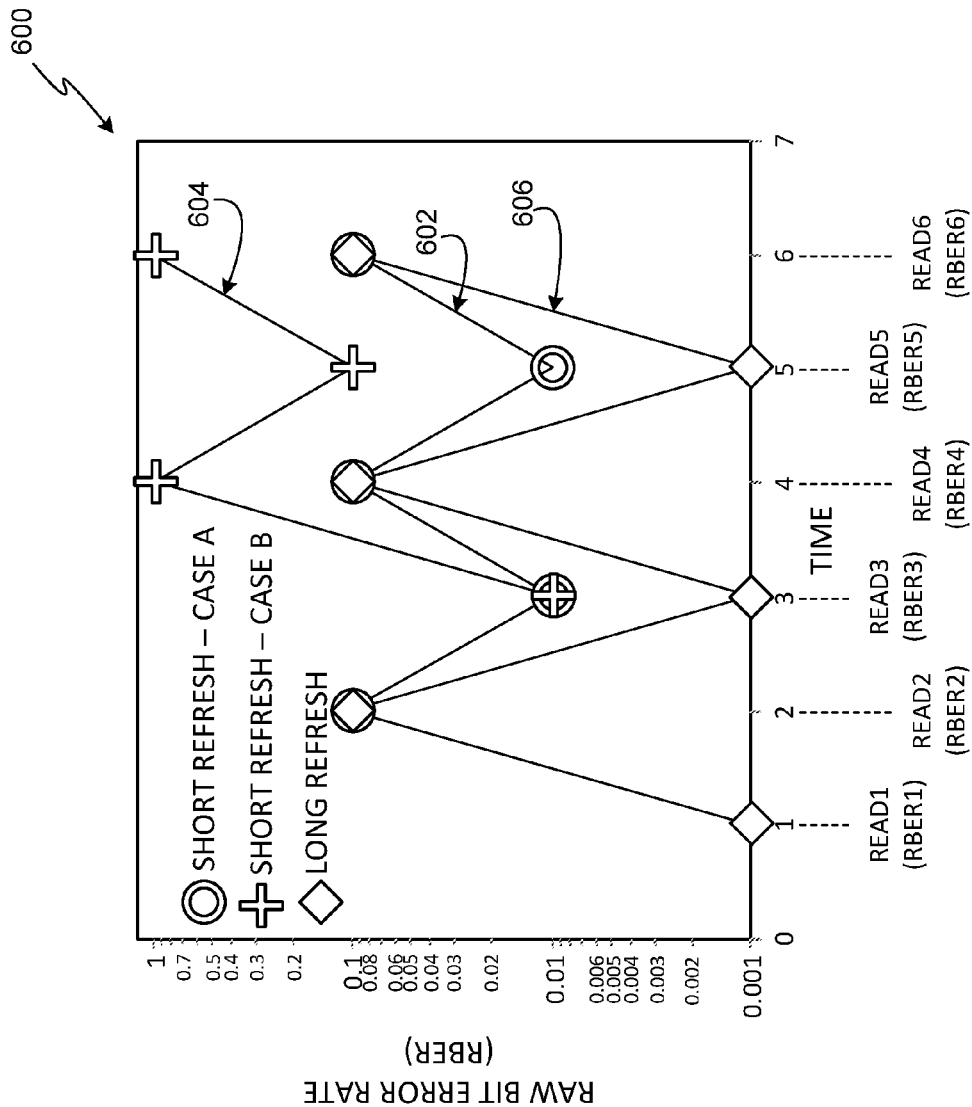
FIG. 6 is an example graph showing raw bit error rate (RBER) over time resulting from the example short refreshes of FIG. 5A and the example longer refreshes of FIG. 5B.

FIG. 6 is an example graph 600 showing amounts of raw bit error rate (RBER) over time resulting from the example short refresh operations 504 of FIG. 5A and the example longer refresh operations 506 of FIG. 5B. In the illustrated example, RBER is indicative of the number of bit errors per unit time for read operations. The example graph 600 shows three RBER line plots 602, 604, 606. The RBER line plots 602, 604 correspond to two different scenarios, case A and case B, for the short refresh operations 504 of FIG. 5A. The RBER line plot 606 corresponds to the longer refresh operations 506 of FIG. 5B.

For the case A scenario of the RBER line plot 602, there are instances in which the short refresh operations 504 are sufficiently long to reduce the effects of threshold voltage ($V_{TH}$) drift to decrease the threshold voltages ($V_{TH}$) 202 of a number of selector devices (e.g., the selector device 120 of FIG. 1) from a higher voltage level at the post-drift threshold voltage ($V_{TH}$) state 210 to a lower voltage level of the pre-drift threshold voltage ($V_{TH}$) state 208 (FIGS. 2 and 4). As such, when the short read PW duration 216 is sufficiently long, fewer memory cells are likely to fail or produce bit errors during subsequent read operations READ4, READ5, READ6, which are shown in FIG. 6 as exhibiting the same or lower bit error rates RBER4, RBER5, RBER6 for the RBER line plot 602.

For the case B scenario of the RBER line plot 604, the short read PW duration 216 (FIG. 5A) used for the short refresh operations 504 is insufficiently short when used to perform the first refresh 504 between the second and third read operations READ2, READ3 (shown in FIG. 5A). That is, due to the insufficiently short duration of the short read PW duration 216, the refresh operation 504 is unable to sufficiently reduce the effects of threshold voltage ($V_{TH}$) drift to decrease the threshold voltages ($V_{TH}$) 202 of a number of selector devices (e.g., the selector device 120 of FIG. 1) from a higher voltage level at the post-drift threshold voltage ($V_{TH}$) state 210 to a lower voltage level of the pre-drift threshold voltage ($V_{TH}$) state 208 (FIGS. 2 and 4). As such, when the short read PW duration 216 is not sufficiently long, more memory cells are likely to fail or produce bit errors during subsequent read operations READ4, READ5, READ6, which are shown in FIG. 6 as exhibiting increased bit error rates RBER4, RBER5, RBER6 for the RBER line plot 604.

For the longer refresh operations 506 of FIG. 5B, the RBER line plot 606 shows that bit error rates are significantly lower for subsequent read operations. For example, after performing the first longer refresh operation 506 between the second and third read operations READ2, READ3 (shown in FIG. 5B), the bit error rate RBER3 for the third read operation READ3 is significantly lower than the bit error rate RBER2 for the previous second read operation READ2. The RBER line plot 606 also shows that subsequent read operations performed after the longer refresh operations 506 of FIG. 5B have better bit error rate performance than corresponding read operations performed after the short refresh operations 504 of FIG. 5A. As such, the graph 600 of FIG. 6 shows the advantages of using relatively longer PW durations for read and/or refresh operations to reduce the effects of threshold voltage ($V_{TH}$) drift on subsequent read operations.

The effects of different PW durations can be modeled during a design phase of NVM devices to select PW durations that generate the desired bit error rate and/or memory access performance. For example, empirical observations of reduced threshold voltage ($V_{TH}$) drift when using the longer refresh operations 506 are due to the increased likelihood that more selector devices (e.g., the selector device 120 of FIG. 1) of an NVM device can be activated, or thresholded, in the post-drift $V_{TH}$ state 210 (FIGS. 2 and 4) when their corresponding threshold voltages ($V_{TH}$) have been significantly reduced. This effect is represented by the example graph 700 of FIG. 7 showing the effects on threshold voltage ($V_{TH}$) drift for memory cells 106 at the pre-drift $V_{TH}$ state 208 and the post-drift $V_{TH}$ state 210 relative to different read PW durations (e.g., the read PW duration 216 of FIGS. 2, 5A, and 5B).

Figure 7:
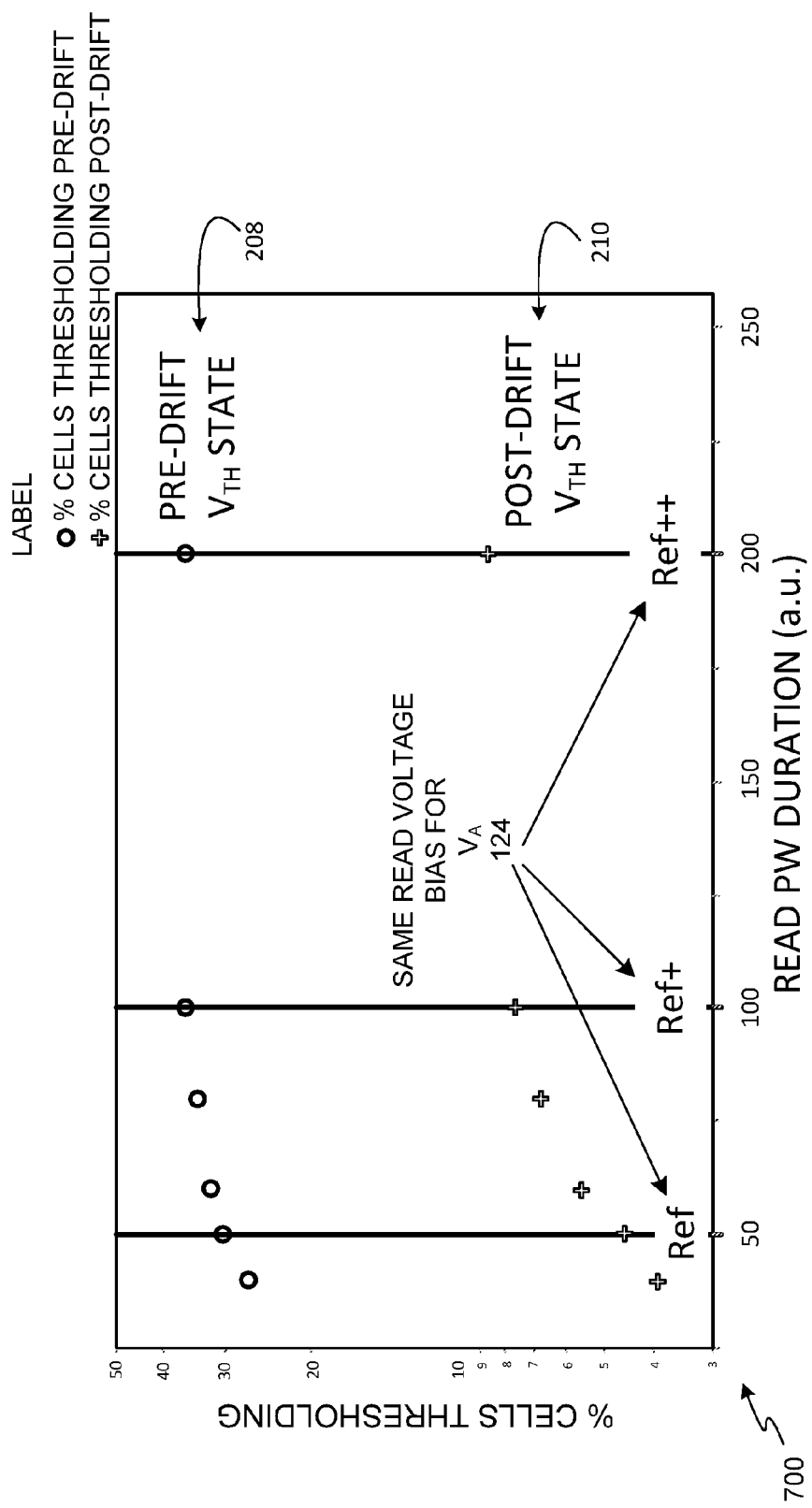
FIG. 7 is an example graph showing the effects of threshold voltage drift on memory cells at a pre-drift time and a post-drift time relative to different read pulse-width durations.

In the example graph 700 of FIG. 7, the same read voltage bias is used for the applied voltage ($V_A$) 124 during the pre-drift $V_{TH}$ state 208 and during the post-drift $V_{TH}$ state 210 using different durations for the read PW duration 216. The illustrated example shows that increasing the read PW durations 216, while using the same voltage bias for the applied voltage ($V_A$) 124, increases the percentage of selector devices that activate. The illustrated example of FIG. 7 also shows that increasing the read PW durations 216 leads to a greater increase in the number of selector devices that activate in the post-drift $V_{TH}$ state 210 but leads to less of an increase in the number of selector devices that activate in the pre-drift $V_{TH}$ state 208. This is due to the manner in which properties of the a-Ch material in the selector devices respond to the longer read PW durations. In addition, the longer read PW durations facilitate overcoming resistive-capacitive (RC) delays created by resistance and capacitance characteristics of integrated circuit structures of memory devices (e.g., the NVM device 104). For example, the percentage of selector devices 120 that activate during the pre-drift $V_{TH}$ state 208 increases by about 30% using the longest shown read PW duration (200 a.u.) relative to the shortest shown read PW duration (50 a.u.). However, the percentage of selector devices 120 that activate during the post-drift $V_{TH}$ state 210 increases by about 200% using the longest shown read PW duration (200 a.u.) relative to the shortest shown read PW duration (50 a.u.). Thus, using examples disclosed herein to reduce threshold voltage ($V_{TH}$) drift by using longer read PW durations 216 without increasing the applied voltage ($V_A$) 124 results in significant improvements of selector device activation in the post-drift $V_{TH}$ state 210.

Figure 8:
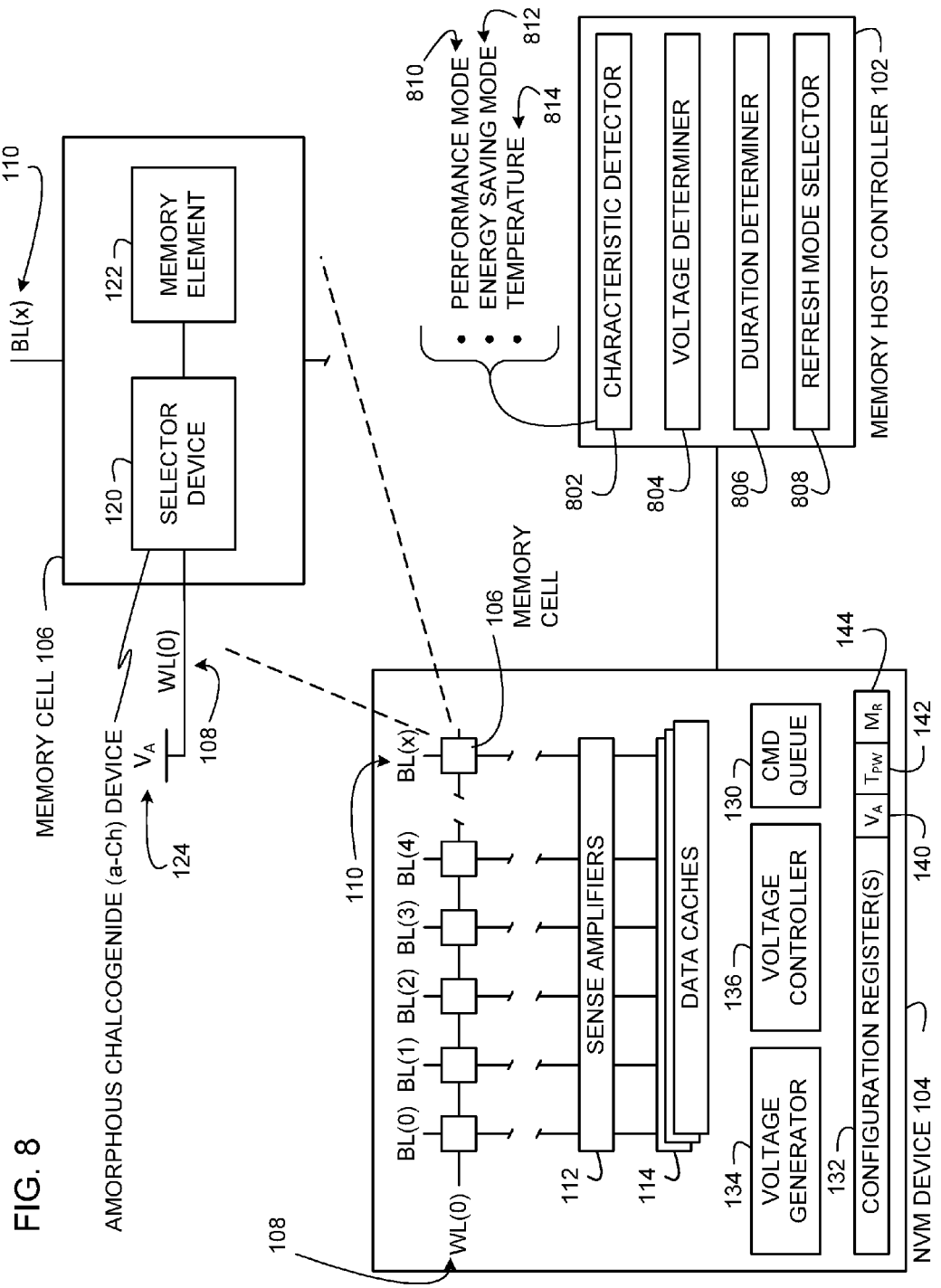
FIG. 8 shows an example of the memory host controller of FIG. 1 which may be implemented in accordance with the teachings of this disclosure to determine threshold voltage drift reduction parameters for use by the example nonvolatile memory device of FIG. 1 to reduce threshold voltage drift in selector devices of memory cells.

FIG. 8 shows an example of the memory host controller 102 of FIG. 1 which may be implemented in accordance with the teachings of this disclosure to determine threshold voltage drift reduction parameters for use by the example NVM device 104 to reduce threshold voltage ($V_{TH}$) drift in selector devices of memory cells (e.g., the selector device 120 of the memory cell 106). For example, the memory host controller 102 shown in FIG. 8 may be used to change the applied voltage ($V_A$) level value 140 and/or the read PW duration ($T_{PW}$) value 142 during operation based on different criteria. In this manner, the memory host controller 102 can alter the operation of the NVM device 104 in real time to satisfy changing requirements of applications, users, operating conditions, system resources, etc.

In the illustrated example, the memory host controller 102 includes an example characteristic detector 802, an example voltage determiner 804, an example duration determiner 806, and an example refresh mode selector 808. Although the example characteristic detector 802, the example voltage determiner 804, the example duration determiner 806, and the example refresh mode selector 808 are described in connection with being implemented in the memory host controller 102, in other examples, one or more of the example characteristic detector 802, the example voltage determiner 804, the example duration determiner 806, and/or the example refresh mode selector 808 may instead be implemented in the NVM device 104.

The memory host controller 102 is provided with the example characteristic detector 802 to detect characteristics that affect what applied voltage ($V_A$) level values 140 and/or read PW duration ($T_{PW}$) values 142 should be used to reduce threshold voltage ($V_{TH}$) drift in accordance with the teachings of this disclosure. Example characteristics that could be detected by the characteristic detector 802 include a performance mode setting 810, an energy saving mode setting 812, and a temperature measurement 814. For example, the performance mode setting 810 may be a user and/or system setting that indicates when the NVM device 104 should operate in a high performance mode (e.g., to provide high data throughput). The example energy saving mode setting 812 may be a user and/or system setting that indicates when the NVM device 104 should operate in a low-power consumption mode by using the least amount of energy while still performing requested memory access operations. The temperature measurement 814 indicates a temperature of the NVM device 104 collected using, for example, a temperature sensor on a printed circuit board, in an IC package with the NVM device 104, and/or on the same semiconductor die as the NVM device. The temperature measurement 814 of the illustrated example can be used in connection with temperature thresholds corresponding to different rates of threshold voltage ($V_{TH}$) drift in the NVM device 104 to determine suitable applied voltage ($V_A$) level values 140 and/or read PW duration ($T_{PW}$) values 142 to reduce threshold voltage ($V_{TH}$) drift at those temperatures. For example, a-Ch material undergoes faster threshold voltage ($V_{TH}$) drift at higher temperatures and lower threshold voltage ($V_{TH}$) drift at lower temperatures.

The example memory host controller 102 is provided with the voltage determiner 804 to determine applied voltage ($V_A$) level values 140 and is provided with the duration determiner 806 to determine read PW duration values 142 for programming into the configuration register(s) 132 of the NVM device 104. In the illustrated example, the voltage determiner 804 determines applied voltage ($V_A$) level values 140 and the duration determiner 806 determines read PW duration values 142 based on characteristics detected by the characteristic detector 802. In some examples, the voltage determiner 804 and/or the duration determiner 806 are provided with one or more look-up tables or data structures in which different applied voltage ($V_A$) level values 140 and/or read PW duration values 142 are stored for corresponding performance mode settings (e.g., corresponding to the performance mode setting 810), energy saving mode settings (e.g., corresponding to the energy saving mode setting 812), and/or temperature values (e.g., corresponding to the temperature measurement 814). In this manner, the voltage determiner 804 can obtain applied voltage ($V_A$) level values 140 and/or the duration determiner 806 can obtain read PW duration values 142 from the one or more look-up tables based on the performance mode settings, the energy saving mode settings, and/or the temperature values. For example, when the performance mode setting 810 indicates that the NVM device 104 should operate in a high-performance mode, the voltage determiner 804 determines to use a relatively high applied voltage ($V_A$) value 140 and the duration determine 806 determines to use a relatively shorter read PW duration ($T_{PW}$) value 142. In this manner, the higher applied voltage ($V_A$) value 140 will activate a selector device 120 quickly during the read PW duration value 142 so that data read performance is high. This mode of operation is useful when electronic devices execute high-performance applications or need to finish tasks quickly (e.g., multitasking, emergency shutdown procedures, etc.).

In some examples, when the energy saving mode setting 812 indicates that the NVM device 104 should operate in a lower power consumption mode, the voltage determiner 804 determines to use a relatively lower applied voltage ($V_A$) value 140 and the duration determine 806 determines to use a relatively longer read PW duration ($T_{PW}$) value 142. In this manner, the lower applied voltage ($V_A$) value 140 will activate a selector device 120 when it is maintained at the selector device 120 for the longer read PW duration ($T_{PW}$) value 142. In such examples, although data throughput performance will decrease, the NVM device 104 will consume less power. This mode of operation is useful to conserve battery power in portable electronics during times when lower performance applications are being executed or when an electronic device enters into a lower power mode and only background processes are being executed.

In the illustrated example, the duration determiner 806 determines the read PW duration ($T_{PW}$) value 142 to satisfy a thresholding duration of the selector device 120. In examples disclosed herein, the thresholding duration is the amount of time that an applied voltage ($V_A$) must be maintained at a selector device 120 to activate the selector device 120 even if the applied voltage ($V_A$) is less than the threshold voltage ($V_{TH}$) of the selector device 120. In examples disclosed herein, the lower the applied voltage ($V_A$), the higher the thresholding duration needed to activate the selector device 120. In some examples, thresholding durations of selector devices 120 for different a-Ch material compositions may be determined empirically during a design phase based on numerous observations while applying different applied voltages ($V_A$) for different PW durations.

The example memory host controller 102 is provided with the example refresh mode selector 808 to determine when the NVM device 104 should reduce threshold voltage ($V_{TH}$) drift by using intentional read operations that read requested data from memory cells or should use "dummy" read operations as refresh operations. For example, the refresh mode selector 808 may use the performance mode setting 810 and/or the energy saving mode setting 812 detected by the characteristic detector 802 to determine which mode the NVM device 104 should use for reducing threshold voltage ($V_{TH}$) drift. In some examples, when the performance mode setting 810 indicates that the NVM device 104 should operate in a high-performance mode, the refresh mode selector 808 programs the refresh mode ($M_R$) setting 144 in the configuration registers 132 of the NVM device 104 to cause the NVM device 104 to use "dummy" read operations as refresh operations to reduce threshold voltage ($V_{TH}$) drift. By using "dummy" read operations as refresh operations separate from intentional read operations, the NVM device 104 can execute fast intentional read operations to retrieve data quickly without needing to perform those intentional read operations using longer PW durations to reduce threshold voltage ($V_{TH}$) drift. In other examples, when the energy saving mode setting 812 indicates that the NVM device 104 should operate in a lower power consumption mode, the refresh mode selector 808 programs the refresh mode ($M_R$) setting 144 in the configuration registers 132 of the NVM device 104 to cause the NVM device 104 to use intentional read operations to reduce the threshold voltage ($V_{TH}$) drift of selector devices 120. By using the intentional read operations to reduce the threshold voltage ($V_{TH}$) drift, the NVM device 104 does not need to use additional energy to perform additional "dummy" read operations as refresh operations.

While an example manner of implementing the memory host controller 102 and/or the NVM device 104 are illustrated in FIGS. 1 and 8, one or more of the elements, processes and/or devices illustrated in FIGS. 1 and/or 8 may be combined, divided, re-arranged, omitted, eliminated and/or implemented in any other way. Further, the example command queue 130, the example voltage generator 134, the example voltage controller 136, the example characteristic detector 802, the example voltage determiner 804, the example duration determiner 806, the example refresh mode selector 808 and/or, more generally, the example memory host controller 102 and/or the example NVM device 104 of FIGS. 1 and/or 8 may be implemented by hardware, software, firmware and/or any combination of hardware, software and/or firmware. Thus, for example, any of the example command queue 130, the example voltage generator 134, the example voltage controller 136, the example characteristic detector 802, the example voltage determiner 804, the example duration determiner 806, the example refresh mode selector 808 and/or, more generally, the example memory host controller 102 and/or the example NVM device 104 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example command queue 130, the example voltage generator 134, the example voltage controller 136, the example characteristic detector 802, the example voltage determiner 804, the example duration determiner 806, and/or the example refresh mode selector 808 is/are hereby expressly defined to include a tangible computer readable storage device or storage disk such as a memory, a digital versatile disk (DVD), a compact disk (CD), a Blu-ray disk, etc. storing the software and/or firmware. Further still, the example memory host controller 102 and/or the example NVM device 104 of FIGS. 1 and/or 8 may include one or more elements, processes and/or devices in addition to, or instead of, those illustrated in FIGS. 1 and 8, and/or may include more than one of any or all of the illustrated elements, processes and devices.

Figure 9:
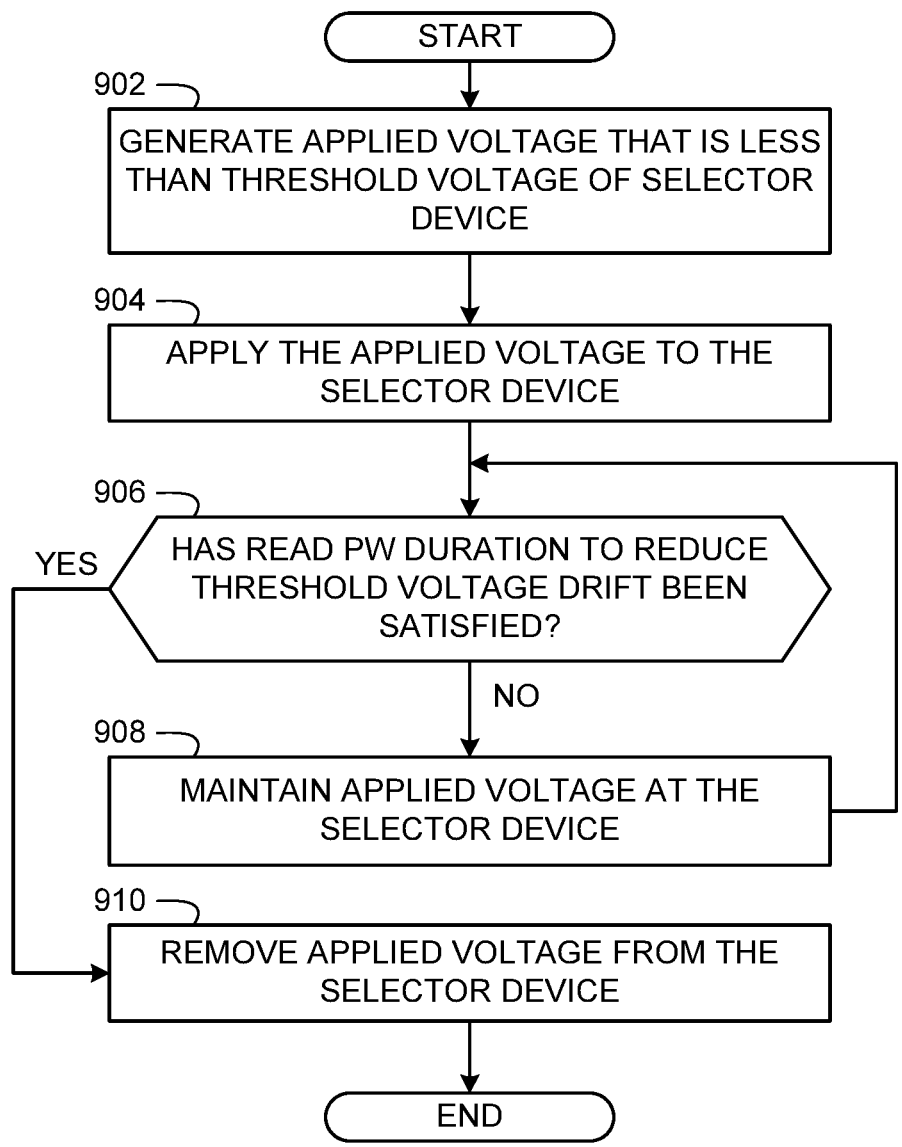
FIG. 9 is a flow diagram representative of example computer readable instructions that may be executed to implement the example nonvolatile memory device of FIGS. 1 and/or 8 to reduce threshold voltage drift in selector devices of memory cells by using read operations as refresh operations.
Figure 10:
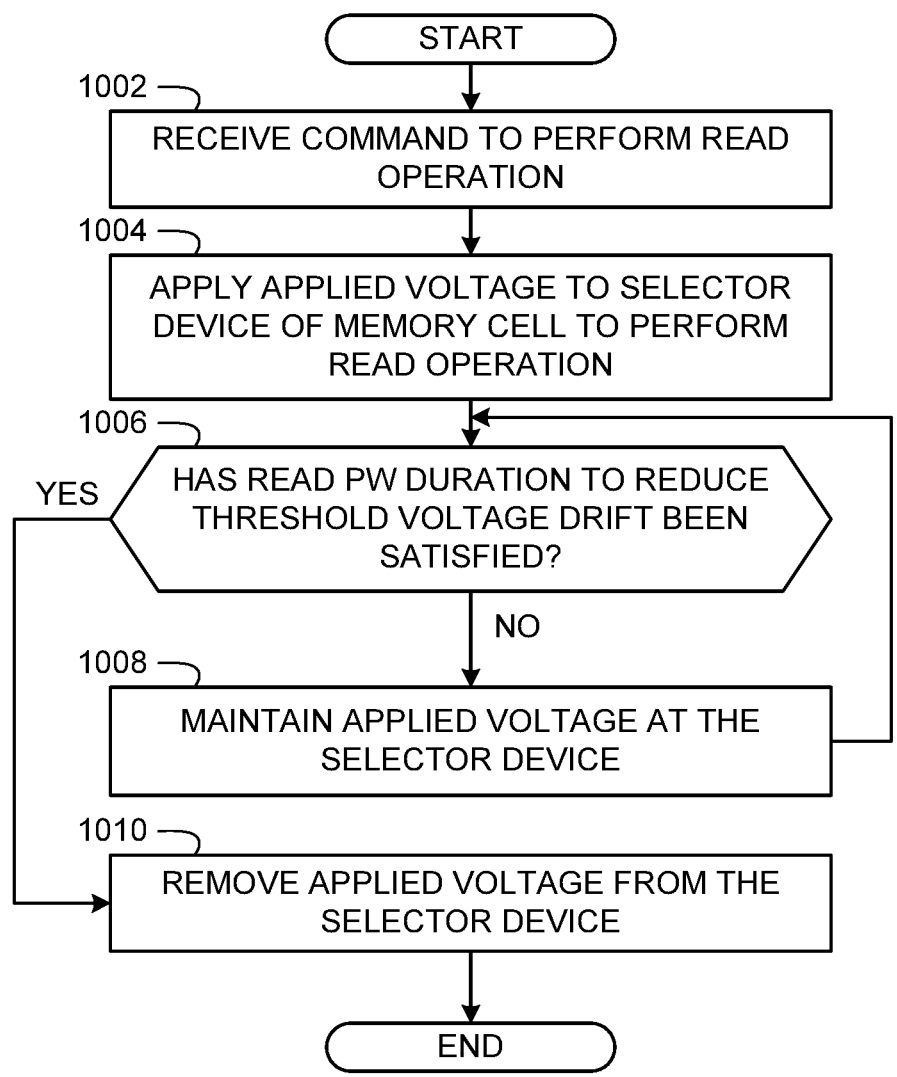
FIG. 10 is a flow diagram representative of example computer readable instructions that may be executed to implement the example nonvolatile memory device of FIGS. 1 and/or 8 to reduce threshold voltage drift in selector devices of memory cells by using intentional read operations requested by a memory host controller.
Figure 11:
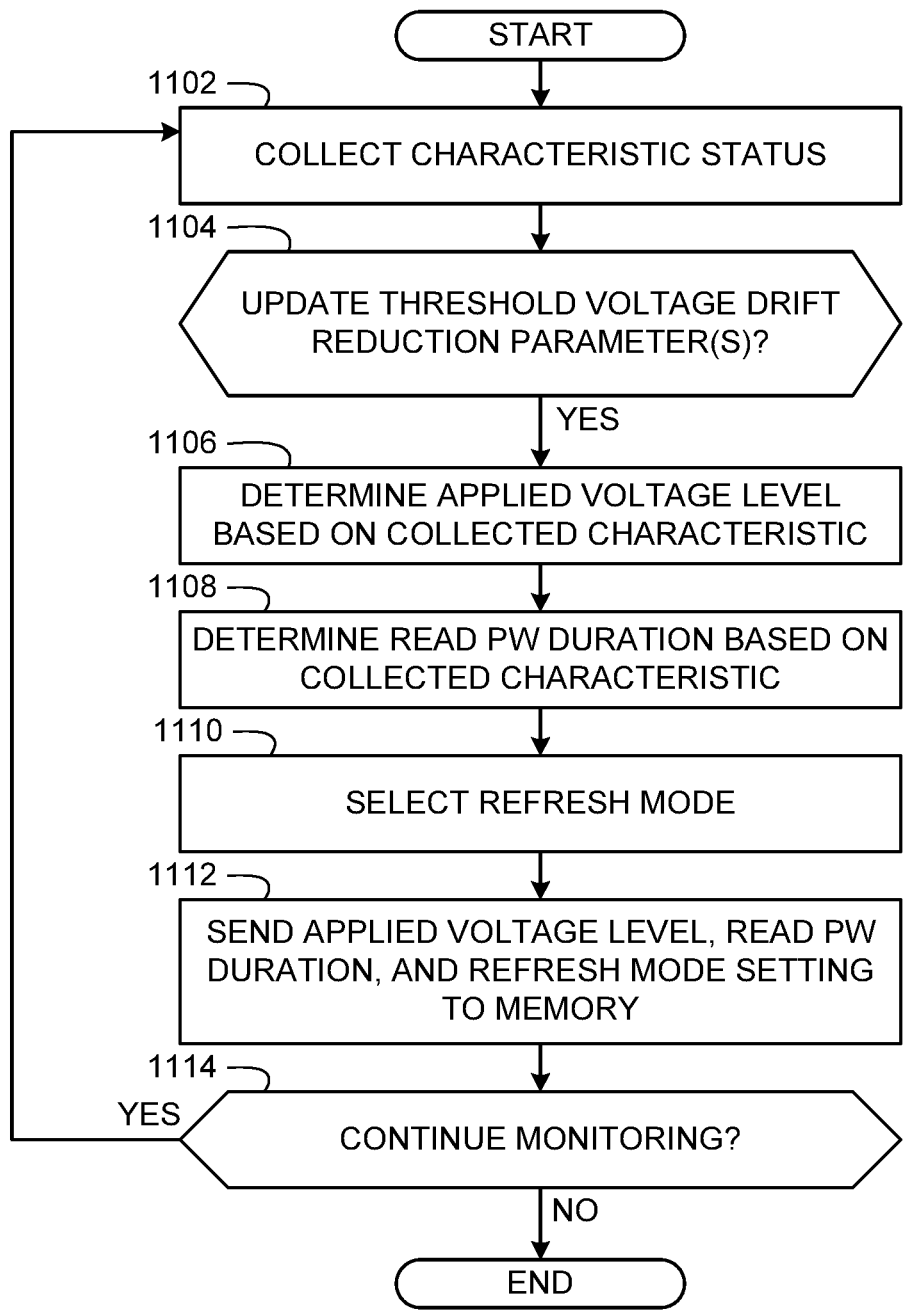
FIG. 11 is a flow diagram representative of example computer readable instructions that may be executed to implement the example memory host controller of FIGS. 1 and/or 8 to determine threshold voltage drift reduction parameters for use by the example nonvolatile memory device of FIGS. 1 and/or 8 to reduce threshold voltage drift in selector devices of memory cells.

Flowcharts representative of example machine readable instructions for implementing the NVM device 104 of FIGS. 1 and/or 8 are shown in FIGS. 9 and 10. A flowchart representative of example machine readable instructions for implementing the memory host controller 102 of FIGS. 1 and/or 8 is shown in FIG. 11. In these examples, the machine readable instructions include one or more programs for execution by a processor such as the processor 1212 shown in the example processor platform 1200 discussed below in connection with FIG. 12. The program(s) may be embodied in software stored on a tangible computer readable storage medium such as a CD-ROM, a floppy disk, a hard drive, a digital versatile disk (DVD), a Blu-ray disk, or a memory associated with the processor 1212, but the entire program(s) and/or parts thereof could alternatively be executed by one or more devices other than the processor 1212 and/or embodied in firmware or dedicated hardware. Further, although the example program(s) is/are described with reference to the flowcharts illustrated in FIGS. 9-11, many other methods of implementing the example memory host controller 102 and/or the example NVM device 104 may alternatively be used. For example, the order of execution of the blocks may be changed, and/or some of the blocks described may be changed, eliminated, or combined.

As mentioned above, the example processes of FIGS. 9-11 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 9-11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 9 is a flow diagram representative of example computer readable instructions that may be executed to implement the example NVM device 104 of FIGS. 1 and/or 8 to reduce threshold voltage ($V_{TH}$) drift in selector devices (e.g., the selector device 120) of memory cells (e.g., the memory cell 106) by using "dummy" read operations as refresh operations. The example program of FIG. 9 begins at block 902, at which the voltage generator 134 (FIGS. 1 and/or 8) generates an applied voltage ($V_A$) 124 that is less than a threshold voltage ($V_{TH}$) 202 (FIGS. 2 and 4) of the example selector device 120 (FIGS. 1 and/or 8). For example, the voltage generator 134 can generate the applied voltage ($V_A$) 124 based on the applied voltage ($V_A$) level value 140 in the one or more configuration registers 132 of FIGS. 1 and/or 8.

The example voltage controller 136 (FIGS. 1 and/or 8) applies the applied voltage ($V_A$) 124 to the example selector device 120 (block 904). The example voltage controller 136 determines whether the read PW duration ($T_{PW}$) 142 (FIGS. 1 and/or 8) to reduce the threshold voltage ($V_{TH}$) drift has been satisfied (block 906). For example, as described above, the read PW duration ($T_{PW}$) 142 corresponds to a thresholding duration of the selector device 120, which is the amount of time that the applied voltage ($V_A$) 124 must be maintained at the selector device 120 to activate the selector device 120 even if the applied voltage ($V_A$) 124 is less than the threshold voltage ($V_{TH}$) 202 (FIGS. 2 and 4) of the selector device 120. If at block 906 the voltage controller 136 determines that the read PW duration ($T_{PW}$) 142 has not been satisfied, the voltage controller 136 maintains the applied voltage ($V_A$) 124 at the selector device 120 (block 908), and control returns to block 906. When the voltage controller 136 determines at block 906 that the read PW duration 142 ($T_{PW}$) has been satisfied, the voltage controller 136 removes the applied voltage ($V_A$) 124 from the selector device 120 (block 910), and the example process of FIG. 9 ends.

FIG. 10 is a flow diagram representative of example computer readable instructions that may be executed to implement the example NVM device 104 of FIGS. 1 and/or 8 to reduce threshold voltage ($V_{TH}$) drift in selector devices (e.g., the selector device 120 of FIGS. 1 and/or 8) of memory cells (e.g., the memory cells 106 of FIGS. 1 and/or 8) by using intentional read operations requested by the example memory host controller 102 (FIGS. 1 and/or 8). The example program of FIG. 10 begins at block 1002 at which the command queue 130 (FIGS. 1 and/or 8) receives a memory access command to perform a read operation. For example, the command queue 130 may receive the memory access command from the memory host controller 102 (FIGS. 1 and/or 8). The voltage controller 136 applies an applied voltage ($V_A$) 124 to the selector device 120 of the memory cell 106 (FIGS. 1 and/or 8) to perform the read operation (block 1004). In the illustrated example, the applied voltage ($V_A$) 124 may be generated by the voltage generator 134 based on the applied voltage ($V_A$) level value 140 (FIGS. 1 and/or 8). In some examples of the illustrated example of FIG. 10, the applied voltage ($V_A$) 124 may exceed the threshold voltage ($V_{TH}$) 202 (FIGS. 2 and 4) of the selector device 120. In other examples of the illustrated example of FIG. 10, the applied voltage (VA) 124 is less than the threshold voltage ($V_{TH}$) 202 (FIGS. 2 and 4) of the selector device 120.

The example voltage controller 136 determines whether the read PW duration ($T_{PW}$) 142 (FIGS. 1 and/or 8) to reduce the threshold voltage ($V_{TH}$) drift has been satisfied (block 1006). If at block 1006 the voltage controller 136 determines that the read PW duration ($T_{PW}$) 142 has not been satisfied, the voltage controller 136 maintains the applied voltage ($V_A$) 124 at the selector device 120 (block 1008), and control returns to block 1006. When the voltage controller 136 determines at block 1006 that the read PW duration ($T_{PW}$) 142 has been satisfied, the voltage controller 136 removes the applied voltage ($V_A$) 124 from the selector device 120 (block 1010), and the example process of FIG. 10 ends.

FIG. 11 is a flow diagram representative of example computer readable instructions that may be executed to implement the example memory host controller 102 of FIGS. 1 and/or 8 to determine example applied voltage ($V_A$) level values 140 and/or read PW duration ($T_{PW}$) values 142 (FIGS. 1 and/or 8) for use by the example NVM device 104 of FIG. 1 to reduce threshold voltage ($V_{TH}$) drift in selector devices of memory cells (e.g., the selector device 120 of the memory cell 106 of FIGS. 1 and/or 8). The example program of FIG. 11 begins at block 1102 at which the example characteristic detector 802 (FIG. 8) collects a characteristic status. For example, the characteristic detector 802 may access the performance mode setting 810 (FIG. 8), the energy saving mode setting 812 (FIG. 8), and/or the temperature measurement 814 (FIG. 8) indicative of a temperature of the example NVM device 104. The memory host controller 102 determines whether to update one or more threshold voltage ($V_{TH}$) drift reduction parameters (block 1104). For example, the memory host controller 102 may determine to update one or more of the applied voltage ($V_A$) level value 140, the read PW duration ($T_{PW}$) value 142, and/or the refresh mode ($M_R$) setting 144 (FIG. 8) based on the characteristic status collected at block 1102.

In the illustrated example, when the memory host controller 102 determines at block 1104 that it should update one or more of the threshold voltage ($V_{TH}$) drift reduction parameters, the example voltage determiner 804 determines the applied voltage ($V_A$) level value 140 (block 1106). For example, the voltage determiner 804 determines the applied voltage ($V_A$) level value 140 based on the collected characteristic of block 1102 as described above in connection with FIG. 8. Also in the illustrated example, the example duration determiner 806 determines the read PW duration ($T_{PW}$) value 142 (block 1108). For example, the duration determiner 806 determines the read PW duration ($T_{PW}$) value 142 based on the collected characteristic of block 1102 as described above in connection with FIG. 8.

In the illustrated example, the refresh mode selector 808 also selects the refresh mode that is to be used by the NVM device 104 (block 1110). For example, the refresh mode selector 808 selects the refresh mode ($M_R$) setting 144 (FIG. 8) based on the collected characteristic of block 1102 as described above in connection with FIG. 8. The memory host controller 102 sends the applied voltage ($V_A$) level value 140, the read PW duration ($T_{PW}$) value 142, and the refresh mode ($M_R$) setting 144 to the NVM device 104 (block 1112). For example, the memory host controller 102 sends the applied voltage ($V_A$) level value 140, the read PW duration ($T_{PW}$) value 142, and the refresh mode ($M_R$) setting 144 to the NVM device 104 for programming those values in the one or more configuration register(s) 132 (FIG. 8) of the NVM device 104 for use in reducing threshold voltage ($V_{TH}$) drift. Although the above describes updating all of the applied voltage ($V_A$) level value 140, the read PW duration ($T_{PW}$) value 142, and/or the refresh mode ($M_R$) setting 144, in other examples, fewer than all of the threshold voltage drift reduction parameter values may be updated.

After the memory host controller 102 sends the applied voltage ($V_A$) level value 140, the read PW duration ($T_{PW}$) value 142, and the refresh mode ($M_R$) setting 144 to the NVM device 104, or if the memory host controller 102 determines at block 1106 that it should not update the threshold voltage drift reduction parameter values, control advances to block 1114. At block 1114, the memory host controller 102 determines whether to continue monitoring for status changes in characteristics that could require changing one or more of the threshold voltage ($V_{TH}$) reduction parameters. For example, the memory host controller 102 may need to continue monitoring if an electronic device in which the memory host controller 102 is located is still in an active state executing processes that require memory accesses. Alternatively, in some examples, the memory host controller 102 may stop monitoring if the memory subsystem is placed into a sleep mode, a hibernate mode, an inactive state, or is shutdown. If the memory host controller 102 is to continue monitoring, control returns to block 1102. Otherwise, if the memory host controller 102 is not to continue monitoring, the example process of FIG. 11 ends.

Figure 12:
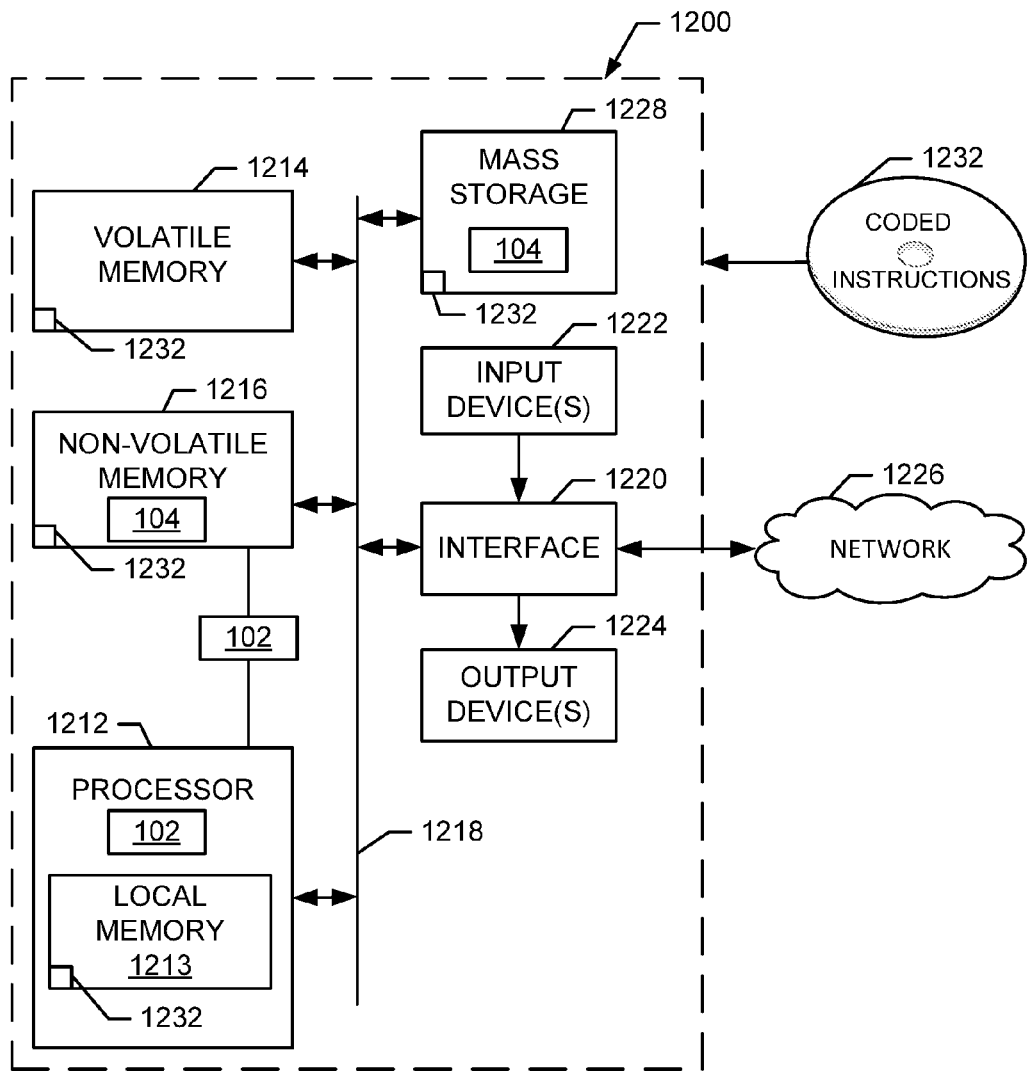
FIG. 12 is an example processor platform capable of executing the example computer readable instructions represented by FIGS. 9-11 to implement the example nonvolatile memory of FIGS. 1 and 8 and/or the example memory host controller of FIGS. 1 and 8 to reduce threshold voltage drift in selector devices of memory cells in accordance with the teachings of this disclosure.

FIG. 12 is an example processor platform capable of executing the example computer readable instructions represented by FIGS. 9-11 to implement the example NVM device 104 of FIGS. 1 and/or 8 and/or the example memory host controller 102 of FIGS. 1 and/or 8 to reduce threshold voltage ($V_{TH}$) drift in selector devices of memory cells (e.g., the selector device 120 of the memory cell 106 of FIGS. 1 and/or 8) in accordance with the teachings of this disclosure. The processor platform 1200 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors or controllers from any desired family or manufacturer.

The processor 1212 of the illustrated example includes a local memory 1213 (e.g., a cache). The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 may be implemented by flash memory and/or any other desired type of memory device. Access to the main memory 1214, 1216 is controlled by one or more memory controllers. In the illustrated example of FIG. 12, the memory host controller 102 may be implemented in the processor 1212 and/or may be implemented separate from the processor 1212. Also in the illustrated example, the NVM device 104 may be implemented in the non-volatile memory 1216 and/or a mass storage device 1228. In some examples, the memory host controller 102 and the NVM device 104 may be fabricated and/or packaged in the same non-volatile memory 1216 and/or in the same mass storage device 1228.

The processor platform 1200 of the illustrated example also includes an interface circuit 1220. The interface circuit 1220 may be implemented by any type of interface standard, such as an Ethernet interface, a universal serial bus (USB), and/or a PCI express interface.

In the illustrated example, one or more input devices 1222 are connected to the interface circuit 1220. The input device(s) 1222 permit(s) a user to enter data and commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1220 of the illustrated example, thus, typically includes a graphics driver card, a graphics driver chip or a graphics driver processor.

The interface circuit 1220 of the illustrated example also includes a communication device such as a transmitter, a receiver, a transceiver, a modem and/or network interface card to facilitate exchange of data with external machines (e.g., computing devices of any kind) via a network 1226 (e.g., an Ethernet connection, a digital subscriber line (DSL), a telephone line, coaxial cable, a cellular telephone system, etc.).

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, RAID systems, and digital versatile disk (DVD) drives.

Coded instructions 1232 for use by the memory host controller 102 and/or the NVM device 104 to implement the example processes of FIGS. 9, 10, and/or 11 may be stored in the non-volatile memory 1216, and/or on a removable tangible computer readable storage medium such as a CD or DVD.

Examples disclosed herein are useful to reduce threshold voltage drift in nonvolatile memory devices using lower applied voltages (e.g., read voltage biases) than used in prior memory devices for reducing threshold voltage drift. Example advantages of using such lower applied voltages include avoiding the need to apply larger voltage biases to memory cells which can lead to changing the electrical characteristics of such memory cells such that the information stored therein becomes corrupt. In addition, using examples disclosed herein decreases power consumption of memory subsystems, thereby, increasing battery life of portable electronic devices. Reducing power use also promotes lower operating temperatures, thereby, increasing system reliability and extending useful life of electronic devices. That is, prolonged durations of high operating temperatures can lead to faster material degradation and, thus, less useful life of electronic devices.

Examples disclosed herein are useful to improve bit error rates associated with reading memory cells. For example, reducing threshold voltages ($V_{TH}$) of selector devices increases the likelihood that more selector devices in a nonvolatile memory device will properly activate to access data in corresponding memory cells during read operations regardless of the amount of drift time that has elapsed since a previous memory access operation. In this manner, examples disclosed herein may be used to improve data reliability of nonvolatile memory devices.

The following pertain to further examples disclosed herein.

Example 1 is a method to reduce a threshold voltage drift of a selector device of a memory cell. The method of Example 1 includes providing an applied voltage to the selector device of the memory cell, the applied voltage being less than a threshold voltage of the selector device; and reducing the threshold voltage drift of the memory cell by maintaining the applied voltage at the selector device for a thresholding duration to activate the selector device.

In Example 2, the subject matter of Example 1 can optionally include that the providing of the applied voltage that is less than the threshold voltage of the selector device is performed in response to detecting that a memory access operation has occurred.

In Example 3, the subject matter of any one of Examples 1-2 can optionally include that the providing of the applied voltage that is less than the threshold voltage of the selector device is performed during a memory access operation requested by a memory host controller.

In Example 4, the subject matter of any one of Examples 1-3 can optionally include that the providing of the applied voltage includes providing the applied voltage to a wordline in circuit with the selector device.

In Example 5, the subject matter of any one of Examples 1-4 can optionally include generating the applied voltage based on an applied voltage level value programmed into a memory device that includes the memory cell, the programming of the applied voltage level value into the memory device occurring during operation of the memory device.

In Example 6, the subject matter of any one of Examples 1-5 can optionally include that the maintaining of the applied voltage at the selector device for the thresholding duration is performed based on a pulse-width duration value programmed into a memory device that includes the memory cell, the programming of the pulse-width duration value into the memory device occurring during operation of the memory device.

In Example 7, the subject matter of any one of Examples 1-6 can optionally include that the selector device includes a Chalcogenide (Ch) material.

Example 8 is a memory device to reduce a threshold voltage drift of a selector device of a memory cell. The memory device of Example 8 includes a voltage controller to provide an applied voltage to the selector device of the memory cell, the applied voltage being less than a threshold voltage of the selector device; and reduce the threshold voltage drift of the memory cell by maintaining the applied voltage at the selector device for a thresholding duration to activate the selector device.

In Example 9, the subject matter of Example 8 can optionally include that the voltage controller is to provide the applied voltage to the selector device in response to detecting that a memory access operation has occurred.

In Example 10, the subject matter of any one of Examples 8-9 can optionally include that the voltage controller is to provide the applied voltage to the selector device during a memory access operation requested by a memory host controller.

In Example 11, the subject matter of any one of Examples 8-10 can optionally include that the voltage controller is to provide the applied voltage to the selector device by providing the applied voltage to a wordline in circuit with the selector device.

In Example 12, the subject matter of any one of Examples 8-11 can optionally include a voltage generator to generate the applied voltage based on an applied voltage level value programmed into the memory device, the programming of the applied voltage level value into the memory device occurring during operation of the memory device.

In Example 13, the subject matter of any one of Examples 8-12 can optionally include that the voltage controller is to maintain the applied voltage at the selector device for the thresholding duration based on a pulse-width duration value programmed into the memory device, the programming of the pulse-width duration value into the memory device occurring during operation of the memory device.

In Example 14, the subject matter of any one of Examples 8-13 can optionally include that the selector device includes a Chalcogenide (Ch) material.

Example 15 is an apparatus including the memory device of any one of Examples 8-14, and further including one or more processors in circuit with the memory device; and a network interface in circuit with the one or more processors.

Example 16 is at least one article of manufacture including machine readable instructions that, when executed, cause a memory device to reduce a threshold voltage drift of a selector device of a memory cell by causing the memory device to at least provide an applied voltage to the selector device of the memory cell, the applied voltage being less than a threshold voltage of the selector device; and reduce the threshold voltage drift of the memory cell by maintaining the applied voltage at the selector device for a thresholding duration to activate the selector device.

In Example 17, the subject matter of Example 16 can optionally include that the instructions are to cause the memory device to provide the applied voltage to the selector device in response to detecting that a memory access operation has occurred.

In Example 18, the subject matter of any one of Examples 16-17 can optionally include that the instructions are to cause the memory device to provide the applied voltage to the selector device during a memory access operation requested by a memory host controller.

In Example 19, the subject matter of any one of Examples 16-18 can optionally include that the instructions are to cause the memory device to provide the applied voltage to a wordline in circuit with the selector device.

In Example 20, the subject matter of any one of Examples 16-19 can optionally include that the instructions are further to cause the memory device to generate the applied voltage based on an applied voltage level value programmed into the memory device, the programming of the applied voltage level value into the memory device occurring during operation of the memory device.

In Example 21, the subject matter of any one of Examples 16-20 can optionally include that the instructions are to cause the memory device to maintain the applied voltage at the selector device for the thresholding duration based on a pulse-width duration value programmed into the memory device, the programming of the pulse-width duration value into the memory device occurring during operation of the memory device.

In Example 22, the subject matter of any one of Examples 16-21 can optionally include that the selector device includes a Chalcogenide (Ch) material.

Example 23 is a method to reduce a threshold voltage drift of a selector device of a memory cell. The method of Example 23 includes receiving a command to perform a memory access operation; applying an applied voltage to the selector device of the memory cell to perform the memory access operation; and maintaining the applied voltage at the selector device for a pulse-width duration to reduce the threshold voltage drift of the selector device, the pulse-width duration being longer than a thresholding duration that is required to activate the a selector device.

In Example 24, the subject matter of Example 23 can optionally include that the memory access operation is a read operation, and the maintaining of the applied voltage at the selector device includes maintaining the applied voltage during the read operation of the memory cell.

In Example 25, the subject matter of any one of Examples 23-24 can optionally include that the maintaining of the applied voltage during the read operation of the memory cell is done based on an electronic device including the memory cell being in an energy saving mode.

In Example 26, the subject matter of any one of Examples 23-25 can optionally include that the applied voltage is less than a threshold voltage of the selector device.

In Example 27, the subject matter of any one of Examples 23-26 can optionally include that the selector device is fabricated using an amorphous Chalcogenide material.

In Example 28, the subject matter of any one of Examples 23-27 can optionally include generating the applied voltage based on an applied voltage level value programmed into a memory device that includes the memory cell, the programming of the applied voltage level value into the memory device occurring during operation of the memory device.

In Example 29, the subject matter of any one of Examples 23-28 can optionally include that the maintaining of the applied voltage at the selector device for a pulse-width duration is performed based on a pulse-width duration value programmed into a memory device that includes the memory cell, the programming of the pulse-width duration value into the memory device occurring during operation of the memory device.

In Example 30, the subject matter of any one of Examples 23-29 can optionally include that the selector device includes a Chalcogenide (Ch) material.

Example 31 is a memory device to reduce a threshold voltage drift of a selector device of a memory cell. The memory device of Example 31 includes a command queue to receive a command to perform a memory access operation; and a voltage controller to: apply an applied voltage to the selector device of the memory cell to perform the memory access operation; and maintain the applied voltage at the selector device for a pulse-width duration to reduce the threshold voltage drift of the selector device, the pulse-width duration being longer than a thresholding duration that is required to activate the a selector device.

In Example 32, the subject matter of Example 31 can optionally include that the memory access operation is a read operation, and the voltage controller is to maintain the applied voltage at the selector device by maintaining the applied voltage during the read operation of the memory cell.

In Example 33, the subject matter of any one of Examples 31-32 can optionally include that the voltage controller is to maintain the applied voltage during the read operation of the memory cell based on an electronic device including the memory cell being in an energy saving mode.

In Example 34, the subject matter of any one of Examples 31-33 can optionally include that the applied voltage is less than a threshold voltage of the selector device.

In Example 35, the subject matter of any one of Examples 31-34 can optionally include that the selector device is fabricated using an amorphous Chalcogenide material.

In Example 36, the subject matter of any one of Examples 31-35 can optionally include a voltage generator to generate the applied voltage based on an applied voltage level value programmed into the memory device, the programming of the applied voltage level value into the memory device occurring during operation of the memory device.

In Example 37, the subject matter of any one Examples 31-36 can optionally include that the voltage controller is to maintain the applied voltage at the selector device for a pulse-width duration based on a pulse-width duration value programmed into the memory device, the programming of the pulse-width duration value into the memory device occurring during operation of the memory device.

In Example 38, the subject matter of any one Examples 31-37 can optionally include that the selector device includes a Chalcogenide (Ch) material.

Example 39 is an apparatus including the memory device of any one of Examples 31-38, and further including one or more processors in circuit with the memory device; and a network interface in circuit with the one or more processors.

Example 40 is at least one article of manufacture including machine readable instructions that, when executed, cause a memory device to reduce a threshold voltage drift of a selector device of a memory cell by causing the memory device to at least receive a command to perform a memory access operation; apply an applied voltage to the selector device of the memory cell to perform the memory access operation; and maintain the applied voltage at the selector device for a pulse-width duration to reduce the threshold voltage drift of the selector device, the pulse-width duration being longer than a thresholding duration that is required to activate the a selector device.

In Example 41, the subject matter of Example 40 can optionally include that the memory access operation is a read operation, and the maintaining of the applied voltage at the selector device includes maintaining the applied voltage during the read operation of the memory cell.

In Example 42, the subject matter of any one of Examples 40-41 can optionally include that the instructions are to cause the memory device to maintain of the applied voltage during the read operation of the memory cell based on an electronic device including the memory cell being in an energy saving mode.

In Example 43, the subject matter of any one of Examples 40-42 can optionally include that the applied voltage is less than a threshold voltage of the selector device.

In Example 44, the subject matter of any one of Examples 40-43 can optionally include that the selector device is fabricated using an amorphous Chalcogenide material.

In Example 45, the subject matter of any one of Examples 40-44 can optionally include that the instructions are further to cause the memory device to generate the applied voltage based on an applied voltage level value programmed into the memory device, the programming of the applied voltage level value into the memory device occurring during operation of the memory device.

In Example 46, the subject matter of any one of Examples 40-45 can optionally include that the instructions are to cause the memory device to maintain the applied voltage at the selector device for a pulse-width duration based on a pulse-width duration value programmed into the memory device, the programming of the pulse-width duration value into the memory device occurring during operation of the memory device.

In Example 47, the subject matter of any one of Examples 40-46 can optionally include that the selector device includes a Chalcogenide (Ch) material.

Example 48 is a memory device to reduce a threshold voltage drift of a selector device of a memory cell. The memory device of Example 48 includes means for controlling voltage to: provide an applied voltage to the selector device of the memory cell, the applied voltage being less than a threshold voltage of the selector device; and reduce the threshold voltage drift of the memory cell by maintaining the applied voltage at the selector device for a thresholding duration to activate the selector device.

In Example 49, the subject matter of Example 48 can optionally include that the means for controlling voltage is to provide the applied voltage to the selector device in response to detecting that a memory access operation has occurred.

In Example 50, the subject matter of any one of Examples 48-49 can optionally include that the means for controlling voltage is to provide the applied voltage to the selector device during a memory access operation requested by a memory host controller.

In Example 51, the subject matter of any one of Examples 48-50 can optionally include that the means for controlling voltage is to provide the applied voltage to the selector device by providing the applied voltage to a wordline in circuit with the selector device.

In Example 52, the subject matter of any one of Examples 48-51 can optionally include means for generating the applied voltage based on an applied voltage level value programmed into the memory device, the programming of the applied voltage level value into the memory device occurring during operation of the memory device.

In Example 53, the subject matter of any one of Examples 48-52 can optionally include that the means for controlling voltage is to maintain the applied voltage at the selector device for the thresholding duration based on a pulse-width duration value programmed into the memory device, the programming of the pulse-width duration value into the memory device occurring during operation of the memory device.

In Example 54, the subject matter of any one of Examples 48-53 can optionally include that the selector device includes a Chalcogenide (Ch) material.

Example 55 is an apparatus including the memory device of any one of Examples 48-54, and further including one or more processors in circuit with the memory device; and a network interface in circuit with the one or more processors.

Example 56 is a memory device to reduce a threshold voltage drift of a selector device of a memory cell. The memory device of Example 56 includes means for receiving a command to perform a memory access operation; and means for controlling voltage to: apply an applied voltage to the selector device of the memory cell to perform the memory access operation; and maintain the applied voltage at the selector device for a pulse-width duration to reduce the threshold voltage drift of the selector device, the pulse-width duration being longer than a thresholding duration that is required to activate the a selector device.

In Example 57, the subject matter of Example 56 can optionally include that the memory access operation is a read operation, and the means for controlling voltage is to maintain the applied voltage at the selector device by maintaining the applied voltage during the read operation of the memory cell.

In Example 58, the subject matter of any one of Examples 56-57 can optionally include that the means for controlling voltage is to maintain the applied voltage during the read operation of the memory cell based on an electronic device including the memory cell being in an energy saving mode.

In Example 59, the subject matter of any one of Examples 56-58 can optionally include that the applied voltage is less than a threshold voltage of the selector device.

In Example 60, the subject matter of any one of Examples 56-59 can optionally include that the selector device is fabricated using an amorphous Chalcogenide material.

In Example 61, the subject matter of any one of Examples 56-60 can optionally include means for generating the applied voltage based on an applied voltage level value programmed into the memory device, the programming of the applied voltage level value into the memory device occurring during operation of the memory device.

In Example 62, the subject matter of any one of Examples 56-61 can optionally include that the means for controlling voltage is to maintain the applied voltage at the selector device for a pulse-width duration based on a pulse-width duration value programmed into the memory device, the programming of the pulse-width duration value into the memory device occurring during operation of the memory device.

In Example 63, the subject matter of any one of Examples 56-62 can optionally include that the selector device includes a Chalcogenide (Ch) material.

Example 64 is an apparatus including the memory device of any one of Examples 56-63 and further including: one or more processors in circuit with the memory device; and a network interface in circuit with the one or more processors.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method to reduce a threshold voltage drift of a memory cell, the method comprising:
   generating an applied voltage based on an applied voltage level value programmed into a memory device that includes the memory cell, the programming of the applied voltage level value into the memory device occurring during operation of the memory device;
   providing the applied voltage to a selector device of the memory cell, the applied voltage being less than a threshold voltage of the selector device; and
   reducing the threshold voltage drift of the memory cell by maintaining the applied voltage at the selector device for a thresholding duration to activate the selector device.

2. A method as defined in claim 1, wherein the providing of the applied voltage that is less than the threshold voltage of the selector device is performed in response to detecting that a memory access operation has occurred.

3. A method as defined in claim 1, wherein the providing of the applied voltage that is less than the threshold voltage of the selector device is performed during a memory access operation requested by a memory host controller.

4. A method as defined in claim 1, wherein the providing of the applied voltage includes providing the applied voltage to a wordline in circuit with the selector device.

5. A method as defined in claim 1, wherein the maintaining of the applied voltage at the selector device for the thresholding duration is performed based on a pulse-width duration value programmed into the memory device that includes the memory cell, the programming of the pulse-width duration value into the memory device occurring during operation of the memory device.

6. A method as defined in claim 1, wherein the selector device includes a Chalcogenide (Ch) material.

7. A memory device to reduce a threshold voltage drift of a memory cell, the memory device comprising:
  a voltage generator to generate an applied voltage based on an applied voltage level value programmed into the memory device, the programming of the applied voltage level value into the memory device occurring during operation of the memory device;
  a voltage controller to:
    provide the applied voltage to a selector device of the memory cell, the applied voltage being less than a threshold voltage of the selector device; and
    reduce the threshold voltage drift of the memory cell by maintaining the applied voltage at the selector device for a thresholding duration to activate the selector device.

8. A memory device as defined in claim 7, wherein the voltage controller is to provide the applied voltage to the selector device in response to detecting that a memory access operation has occurred.

9. A memory device as defined in claim 7, wherein the voltage controller is to provide the applied voltage to the selector device during a memory access operation requested by a memory host controller.

10. A memory device as defined in claim 7, wherein the voltage controller is to provide the applied voltage to the selector device by providing the applied voltage to a wordline in circuit with the selector device.

11. A memory device as defined in claim 7, wherein the voltage controller is to maintain the applied voltage at the selector device for the thresholding duration based on a pulse-width duration value programmed into the memory device, the programming of the pulse-width duration value into the memory device occurring during operation of the memory device.

12. A memory device as defined in claim 7, wherein the selector device includes a Chalcogenide (Ch) material.

13. An apparatus including the memory device of claim 7, and further including:
  one or more processors in circuit with the memory device; and
  a network interface in circuit with the one or more processors.

14. At least one article of manufacture comprising machine readable instructions that, when executed, cause a memory device to reduce a threshold voltage drift of a memory cell by causing the memory device to at least:
  generate an applied voltage based on an applied voltage level value programmed into the memory device, the programming of the applied voltage level value into the memory device occurring during operation of the memory device;
  provide the applied voltage to a selector device of the memory cell, the applied voltage being less than a threshold voltage of the selector device; and
  reduce the threshold voltage drift of the memory cell by maintaining the applied voltage at the selector device for a thresholding duration to activate the selector device.

15. At least one article of manufacture as defined in claim 14, wherein the instructions are to cause the memory device to provide the applied voltage to the selector device in response to detecting that a memory access operation has occurred.

16. At least one article of manufacture as defined in claim 14, wherein the instructions are to cause the memory device to provide the applied voltage to the selector device during a memory access operation requested by a memory host controller.

17. At least one article of manufacture as defined in claim 14, wherein the instructions are to cause the memory device to provide the applied voltage to a wordline in circuit with the selector device.

18. At least one article of manufacture as defined in claim 14, wherein the instructions are to cause the memory device to maintain the applied voltage at the selector device for the thresholding duration based on a pulse-width duration value programmed into the memory device, the programming of the pulse-width duration value into the memory device occurring during operation of the memory device.

19. At least one article of manufacture as defined in claim 14, wherein the selector device includes a Chalcogenide (Ch) material.

20. A method to reduce a threshold voltage drift of a selector device of a memory cell, the method comprising:
  receiving a command to perform a memory access operation;
  applying an applied voltage to the selector device of the memory cell to perform the memory access operation; and
  maintaining the applied voltage at the selector device for a pulse-width duration to reduce the threshold voltage drift of the selector device, the pulse-width duration being longer than a thresholding duration that is required to activate the selector device.

21. A method as defined in claim 20, wherein the memory access operation is a read operation, and the maintaining of the applied voltage at the selector device includes maintaining the applied voltage during the read operation of the memory cell.

22. A method as defined in claim 21, wherein the maintaining of the applied voltage during the read operation of the memory cell is done based on an electronic device including the memory cell being in an energy saving mode.

23. A method as defined in claim 20, wherein the applied voltage is less than a threshold voltage of the selector device.

24. A method as defined in claim 20, wherein the selector device is fabricated using an amorphous Chalcogenide material.

25. A method as defined in claim 20, further including generating the applied voltage based on an applied voltage level value programmed into a memory device that includes the memory cell, the programming of the applied voltage level value into the memory device occurring during operation of the memory device.

26. A method as defined in claim 20, wherein the maintaining of the applied voltage at the selector device for a pulse-width duration is performed based on a pulse-width duration value programmed into a memory device that includes the memory cell, the programming of the pulse-width duration value into the memory device occurring during operation of the memory device.

27. A method as defined in claim 20, wherein the selector device includes a Chalcogenide material.

* * * * *